US012406907B2

(12) United States Patent
Wang et al.

(10) Patent No.: US 12,406,907 B2
(45) Date of Patent: Sep. 2, 2025

(54) SEMICONDUCTOR STRUCTURE WITH CONDUCTIVE_STRUCTURE

(71) Applicant: Taiwan Semiconductor Manufacturing Company, Ltd., Hsinchu (TW)

(72) Inventors: Jia-Heng Wang, Kaohsiung (TW); Pang-Chi Wu, Hsinchu (TW); Chao-Hsun Wang, Taoyuan (TW); Fu-Kai Yang, Hsinchu (TW); Mei-Yun Wang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 505 days.

(21) Appl. No.: 17/721,557

(22) Filed: Apr. 15, 2022

(65) Prior Publication Data
US 2023/0335469 A1 Oct. 19, 2023

(51) Int. Cl.
*H01L 23/482* (2006.01)
*H01L 21/02* (2006.01)
(Continued)

(52) U.S. Cl.
CPC ...... *H01L 23/4821* (2013.01); *H01L 21/0259* (2013.01); *H10D 30/031* (2025.01);
(Continued)

(58) Field of Classification Search
CPC ............ H01L 23/4821; H01L 21/0259; H10D 30/031; H10D 30/6713; H10D 30/6729;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

DE 10 2019 117 925 A1 4/2020
JP 2019-102797 A 6/2019
(Continued)

OTHER PUBLICATIONS

US Office Action dated Aug. 25, 2023 for U.S. Appl. No. 17/978,409.
(Continued)

*Primary Examiner* — Thanh Y. Tran
(74) *Attorney, Agent, or Firm* — Birch, Stewart, Kolasch & Birch, LLP

(57) ABSTRACT

Semiconductor structures and methods for manufacturing the same are provided. The method includes a gate structure formed over a substrate, and a source/drain (S/D) structure formed adjacent to the gate structure. The semiconductor structure includes a dielectric layer formed over the S/D structure, and an S/D contact structure formed over the S/D structure. The S/D contact structure is through the dielectric layer. The semiconductor structure includes a gate contact structure formed through the dielectric layer and landing on the gate structure, and the gate contact structure is in direct contact with the gate structure. The semiconductor structure includes a bridging contact structure covering the gate contact structure and the S/D contact structure, and the bottommost surface of the bridging contact structure is in direct contact with the topmost surface of the S/D contact structure.

20 Claims, 34 Drawing Sheets

(51) Int. Cl.
　　　*H10D 30/01*　　　(2025.01)
　　　*H10D 30/67*　　　(2025.01)
　　　*H10D 62/10*　　　(2025.01)
　　　*H10D 64/01*　　　(2025.01)

(52) U.S. Cl.
　　　CPC ..... *H10D 30/6713* (2025.01); *H10D 30/6729* (2025.01); *H10D 30/6735* (2025.01); *H10D 30/6757* (2025.01); *H10D 62/118* (2025.01); *H10D 64/017* (2025.01); *H10D 64/018* (2025.01)

(58) Field of Classification Search
　　　CPC ........... H10D 30/6735; H10D 30/6757; H10D 62/118; H10D 64/017; H10D 64/018
　　　See application file for complete search history.

(56) References Cited

U.S. PATENT DOCUMENTS

| | | | |
|---|---|---|---|
| 9,349,812 | B2 | 5/2016 | Chen et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,837,414 | B1 | 12/2017 | Balakrishnan et al. |
| 9,847,390 | B1 | 12/2017 | Xie et al. |
| 10,770,388 | B2 | 9/2020 | Xie et al. |
| 11,527,614 | B2 | 12/2022 | Wang et al. |
| 11,961,886 | B2 | 4/2024 | Wang et al. |
| 2014/0077305 | A1 | 3/2014 | Pethe et al. |
| 2018/0053721 | A1 | 2/2018 | Adusumilli et al. |
| 2018/0096935 | A1 | 4/2018 | Kim et al. |
| 2019/0287851 | A1 | 9/2019 | Chen et al. |
| 2019/0385946 | A1 | 12/2019 | Xie et al. |
| 2020/0075574 | A1 | 3/2020 | Smith et al. |
| 2020/0091288 | A1 | 3/2020 | Lee et al. |
| 2020/0321244 | A1 | 10/2020 | Fan et al. |
| 2020/0350421 | A1 | 11/2020 | Khaderbad et al. |
| 2020/0381299 | A1 | 12/2020 | You et al. |
| 2021/0066125 | A1 | 3/2021 | Li et al. |
| 2022/0199775 | A1 | 6/2022 | Park et al. |
| 2022/0223526 | A1* | 7/2022 | Min ................. H01L 29/42392 |
| 2022/0310457 | A1* | 9/2022 | Chang ................ H10D 84/0186 |
| 2022/0336587 | A1* | 10/2022 | Chang ................ H10D 30/6713 |
| 2022/0359677 | A1* | 11/2022 | Jao ................. H01L 21/823481 |

FOREIGN PATENT DOCUMENTS

| | | |
|---|---|---|
| KR | 10-2018-0134158 A | 12/2018 |
| KR | 10-2020-0020631 A | 2/2020 |
| KR | 10-2021-0012084 A | 2/2021 |
| KR | 10-2021-0024405 A | 3/2021 |

OTHER PUBLICATIONS

U.S. Notice of Allowance dated Aug. 8, 2022 for U.S. Appl. No. 17/325,419.

U.S. Office Action for U.S. Appl. No. 18/604,670, dated Dec. 3, 2024.

Korean Notice of Allowance for Korean Application No. 10-2021-0093072 dated Jan. 31, 2024, with partial English translation.

* cited by examiner

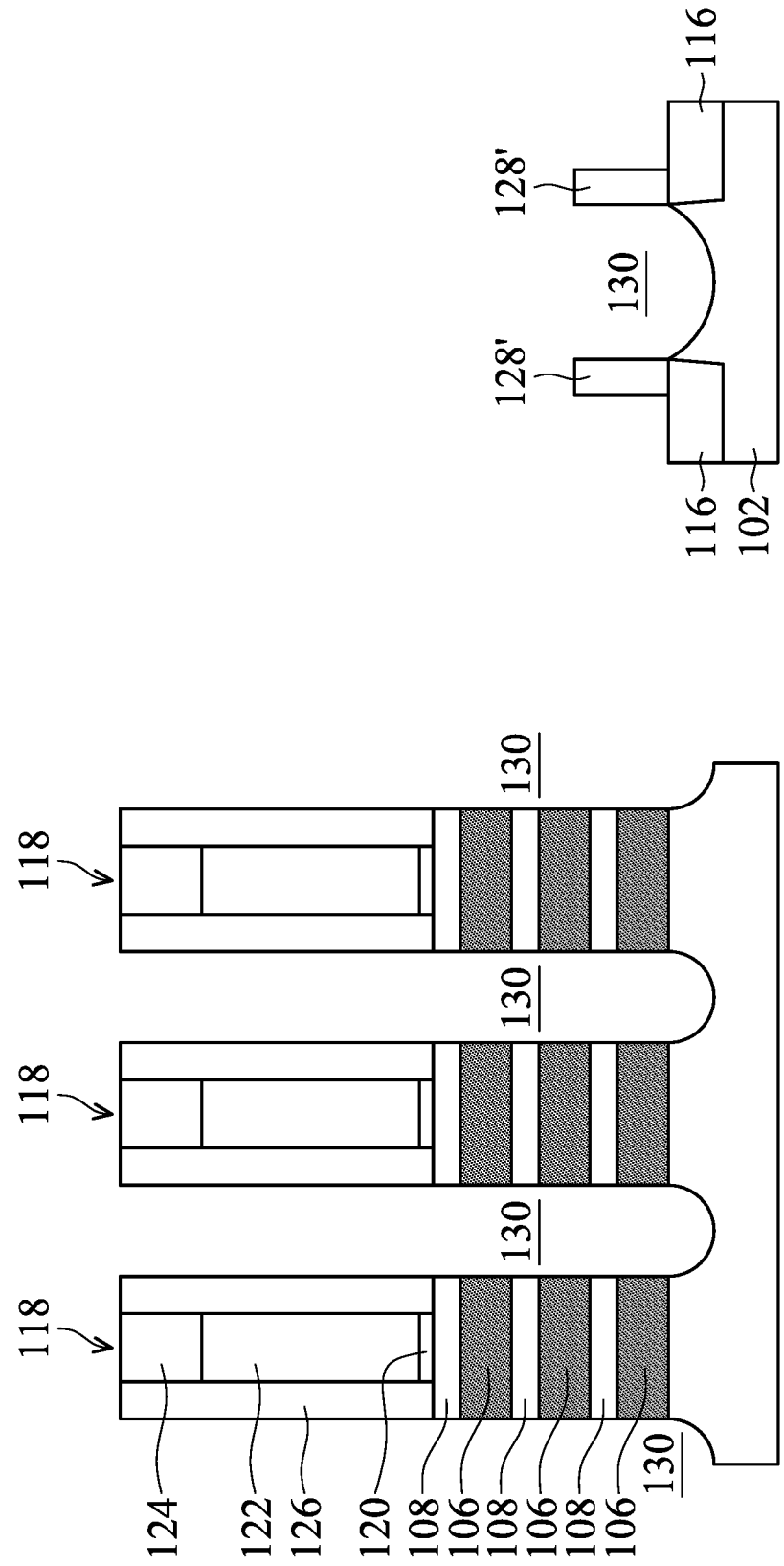

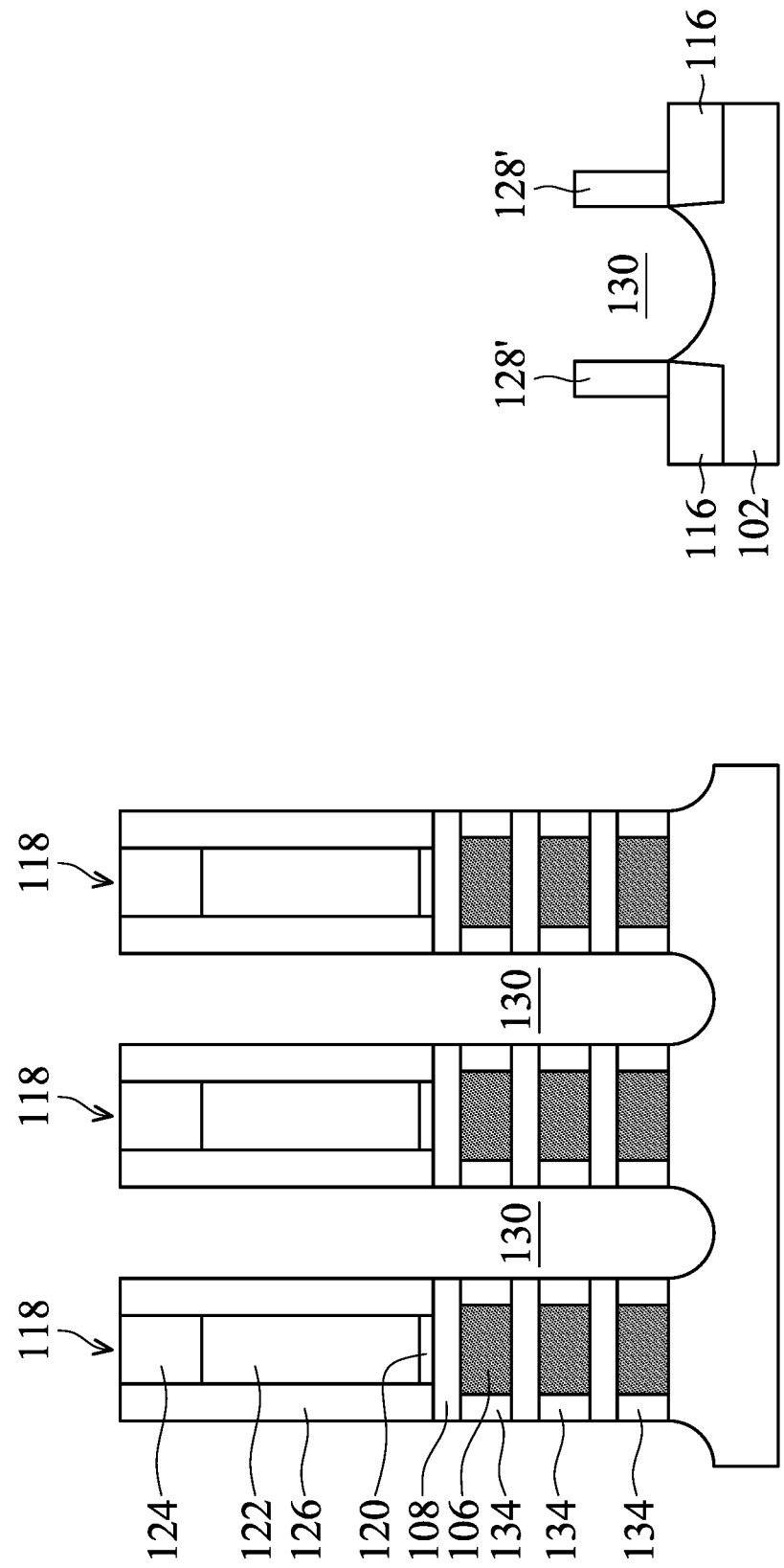

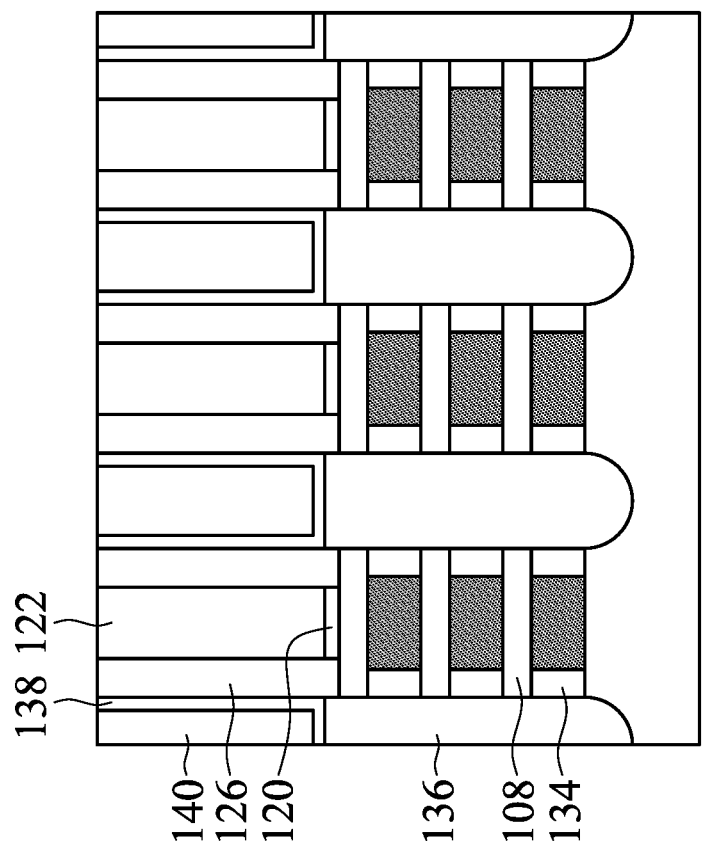
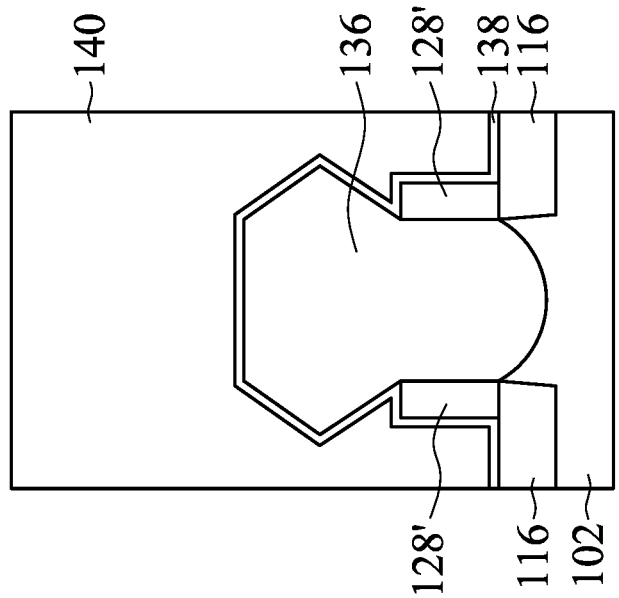
FIG. 2F-1
FIG. 2F-2

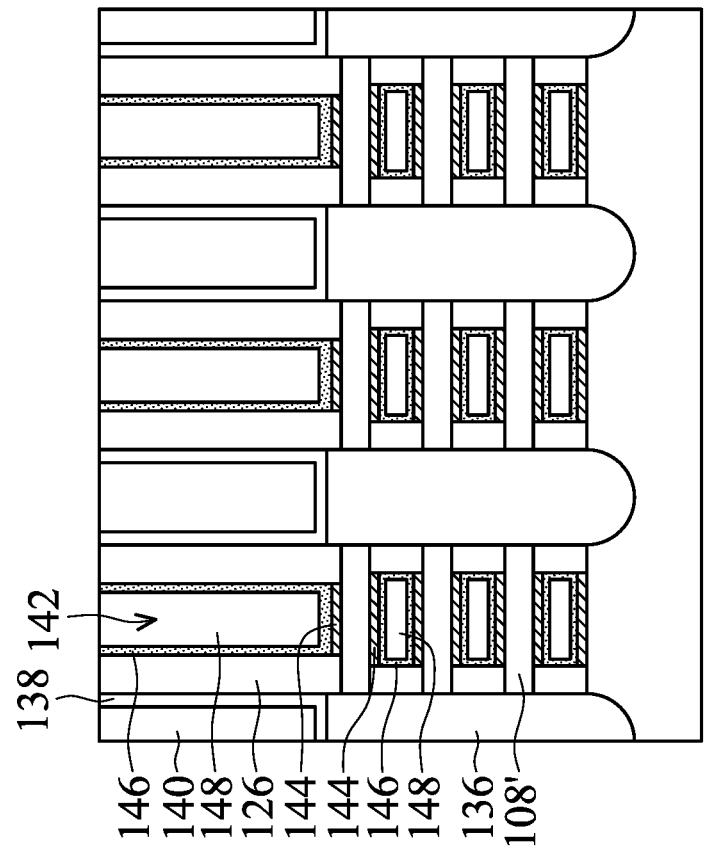
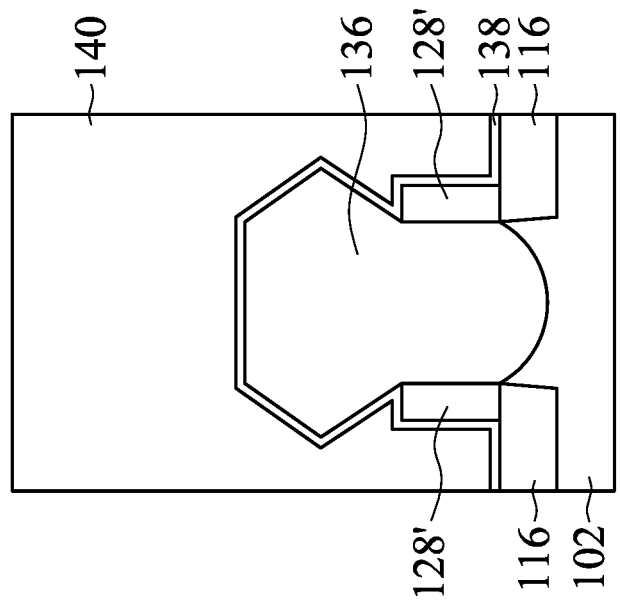
FIG. 2G-1
FIG. 2G-2

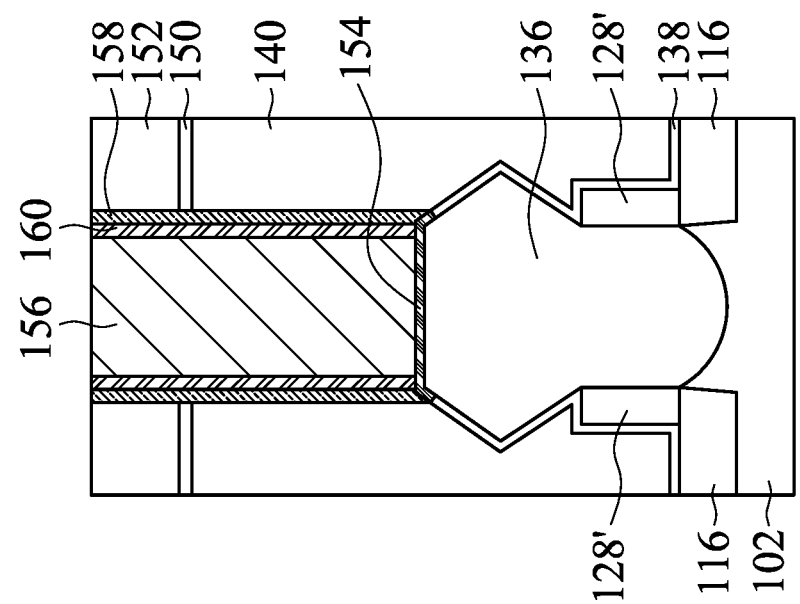
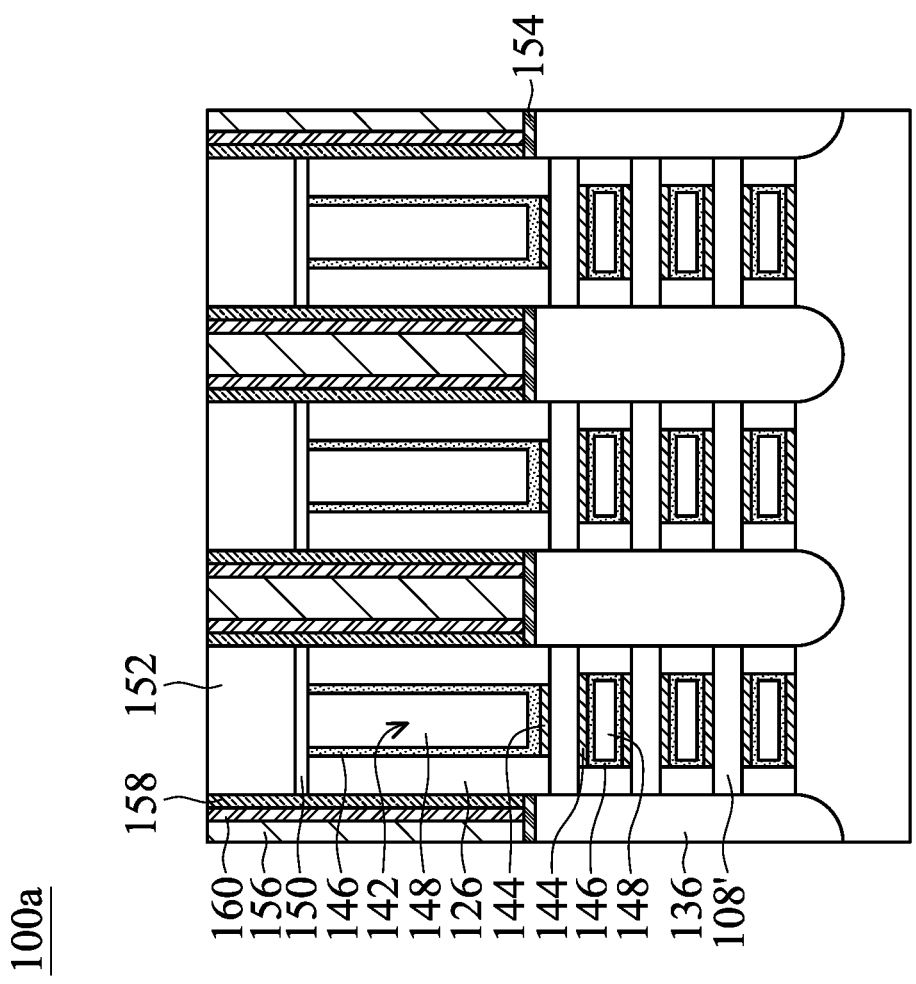
FIG. 2H-2
FIG. 2H-1

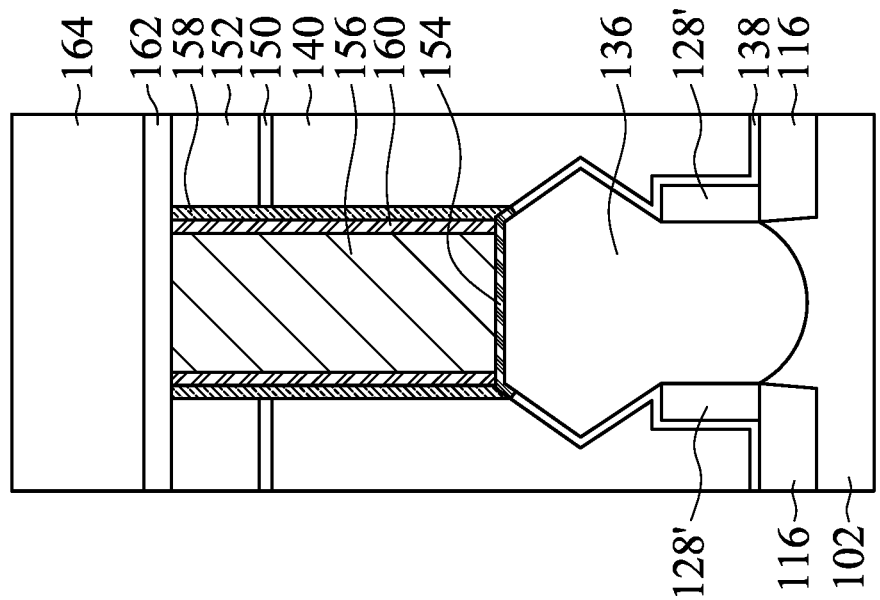
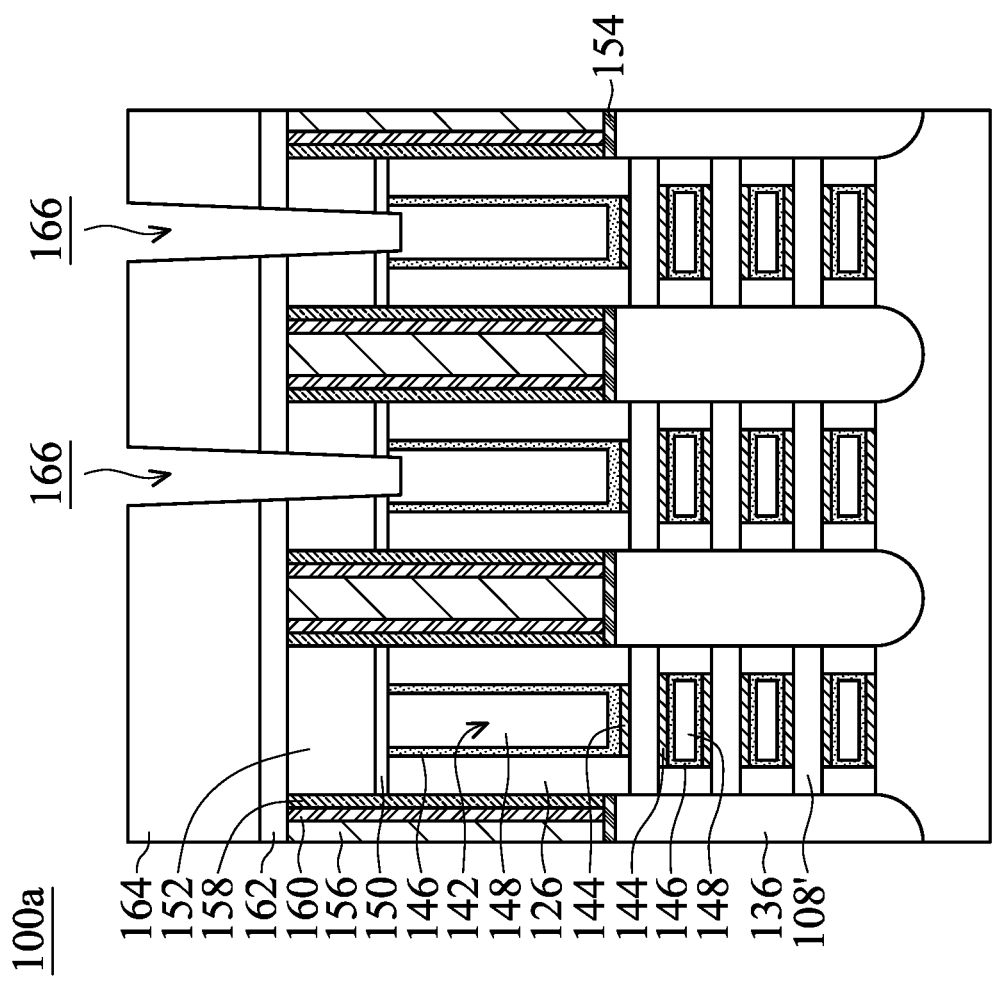
FIG. 2J-1
FIG. 2J-2

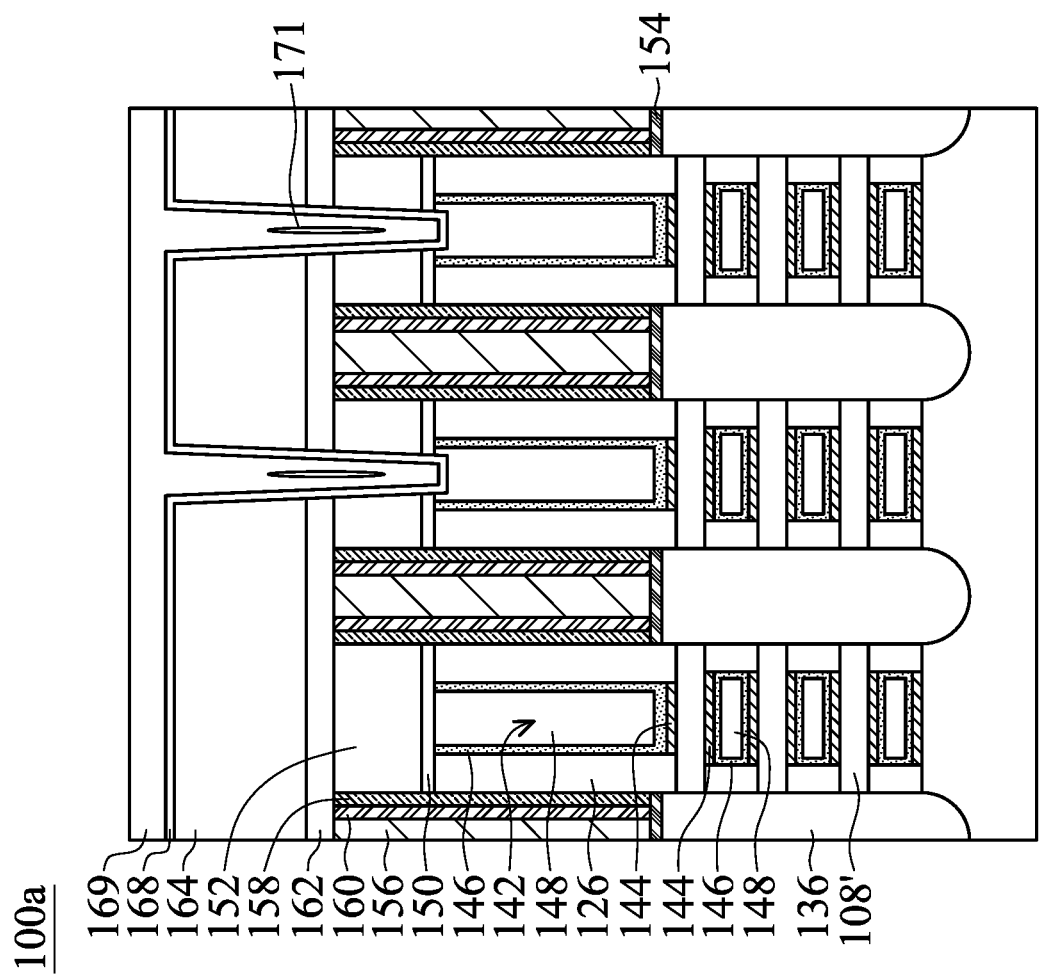
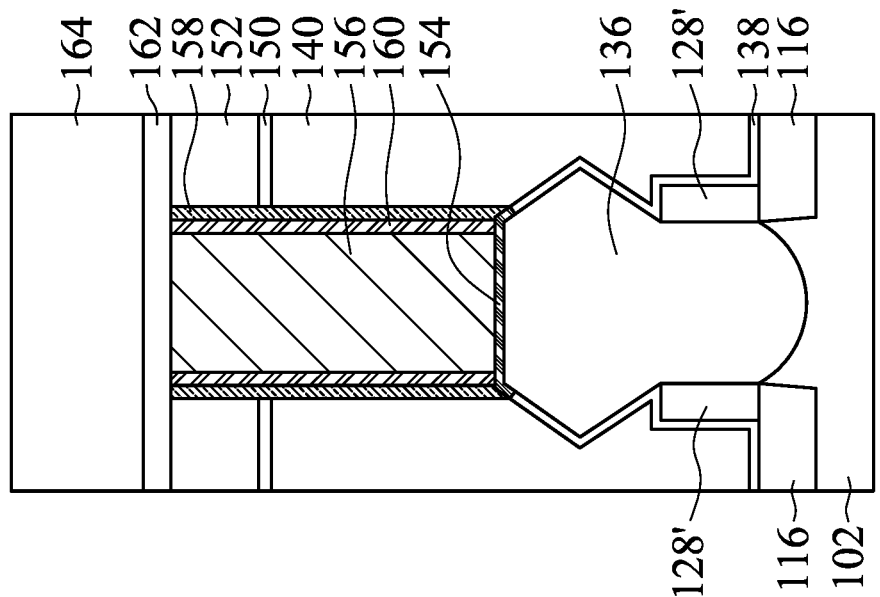
FIG. 2K-1
FIG. 2K-2

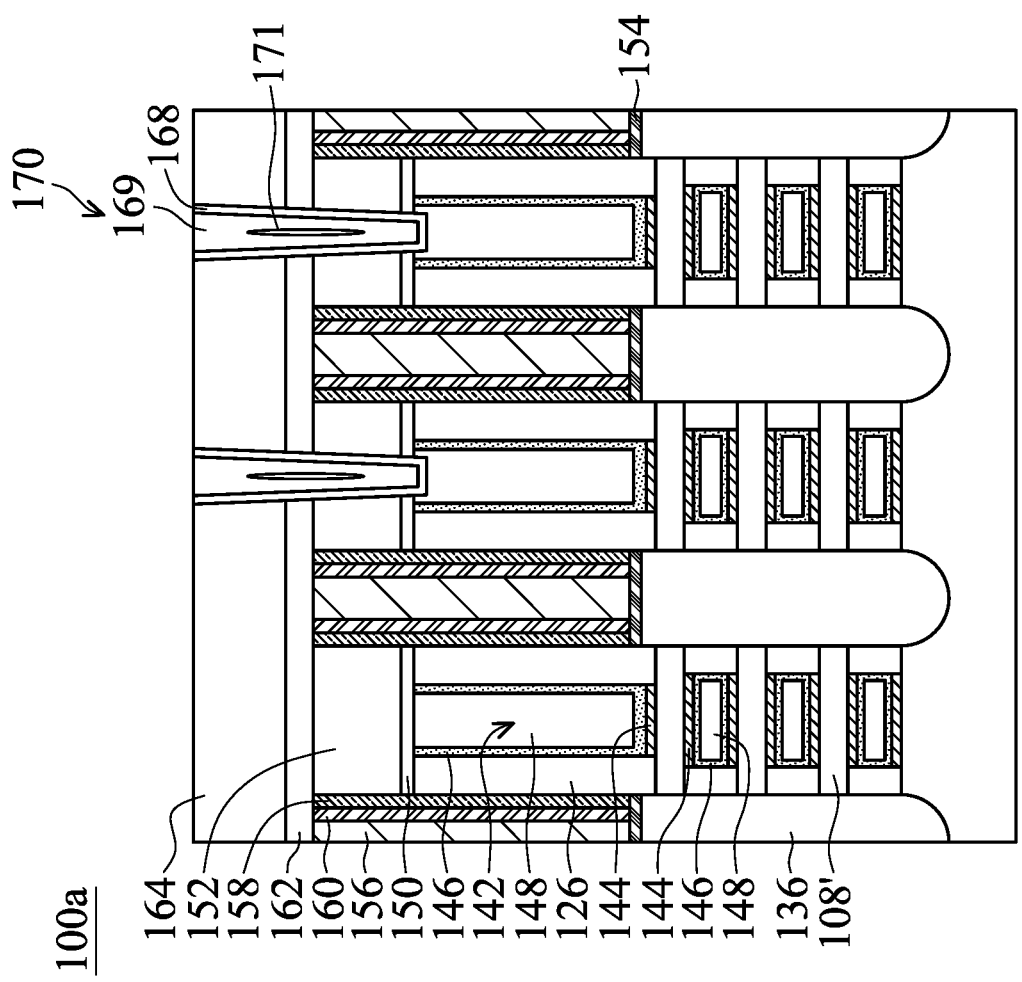
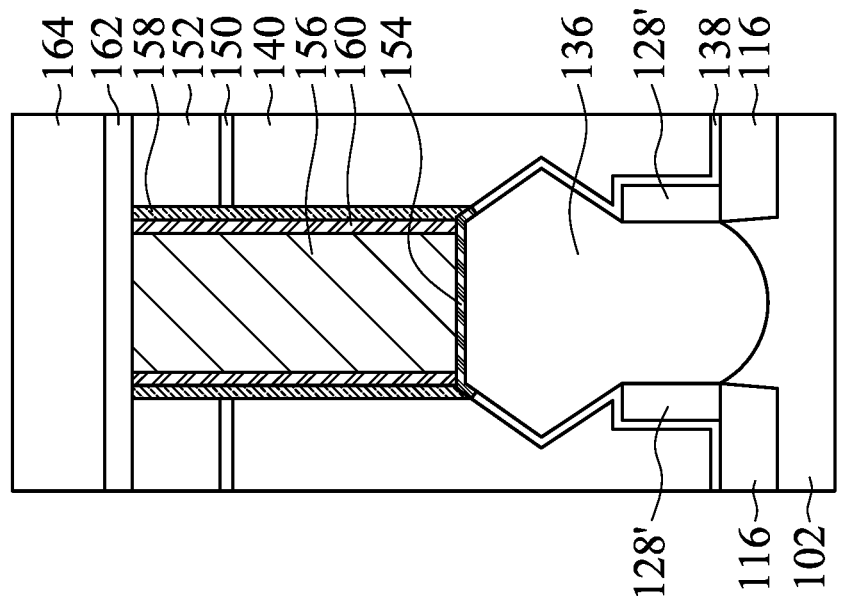
FIG. 2L-1
FIG. 2L-2

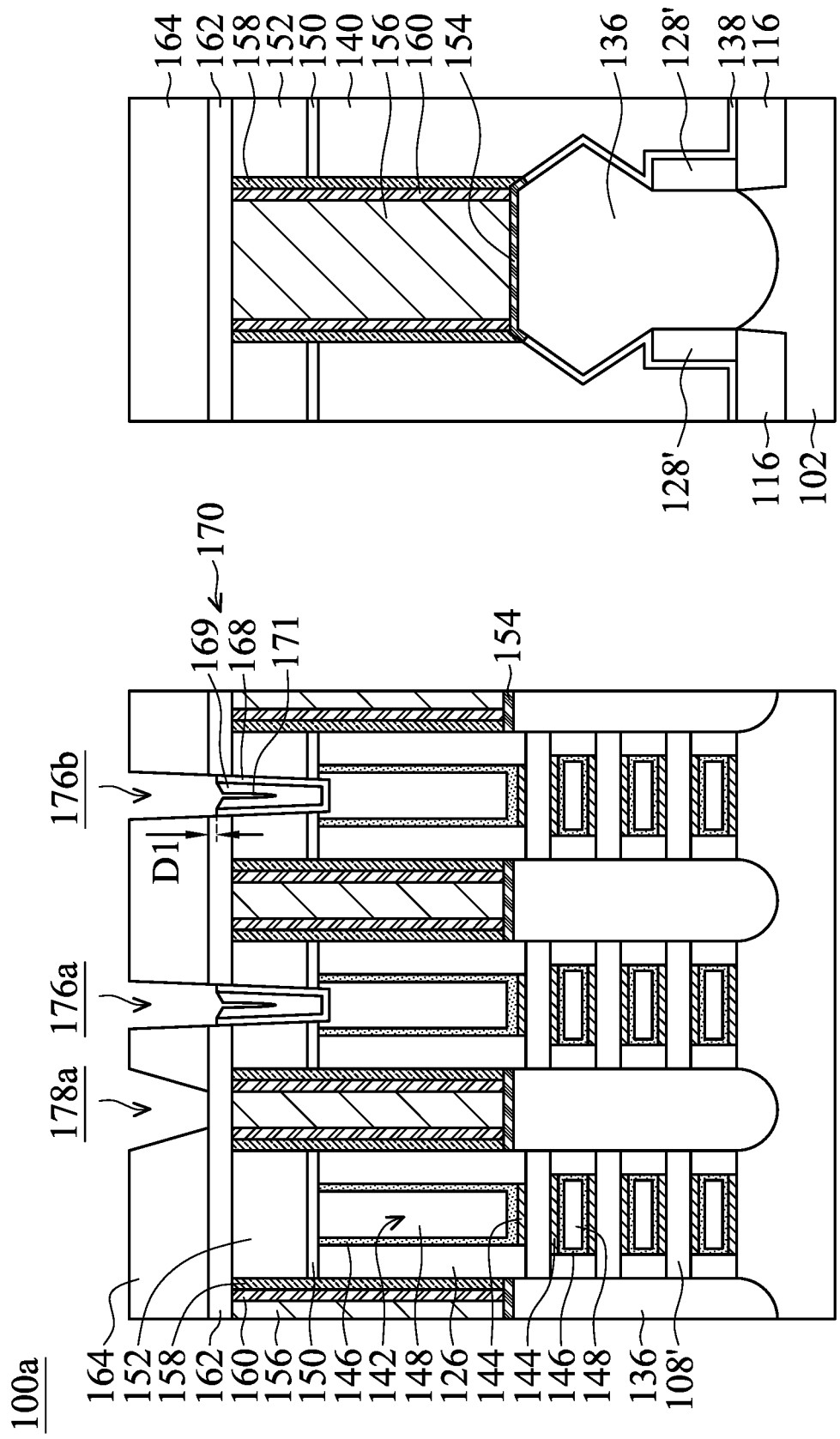

SEMICONDUCTOR STRUCTURE WITH CONDUCTIVE_STRUCTURE

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-1 to 2R-1 illustrate cross-sectional representations of various stages of manufacturing the semiconductor structure shown along line A-A' in FIG. 1E in accordance with some embodiments.

FIGS. 2A-2 to 2R-2 illustrate cross-sectional representations of various stages of manufacturing the semiconductor structure shown along line B-B' in FIG. 1E in accordance with some embodiments.

DETAILED DESCRIPTION

Figure 1A:
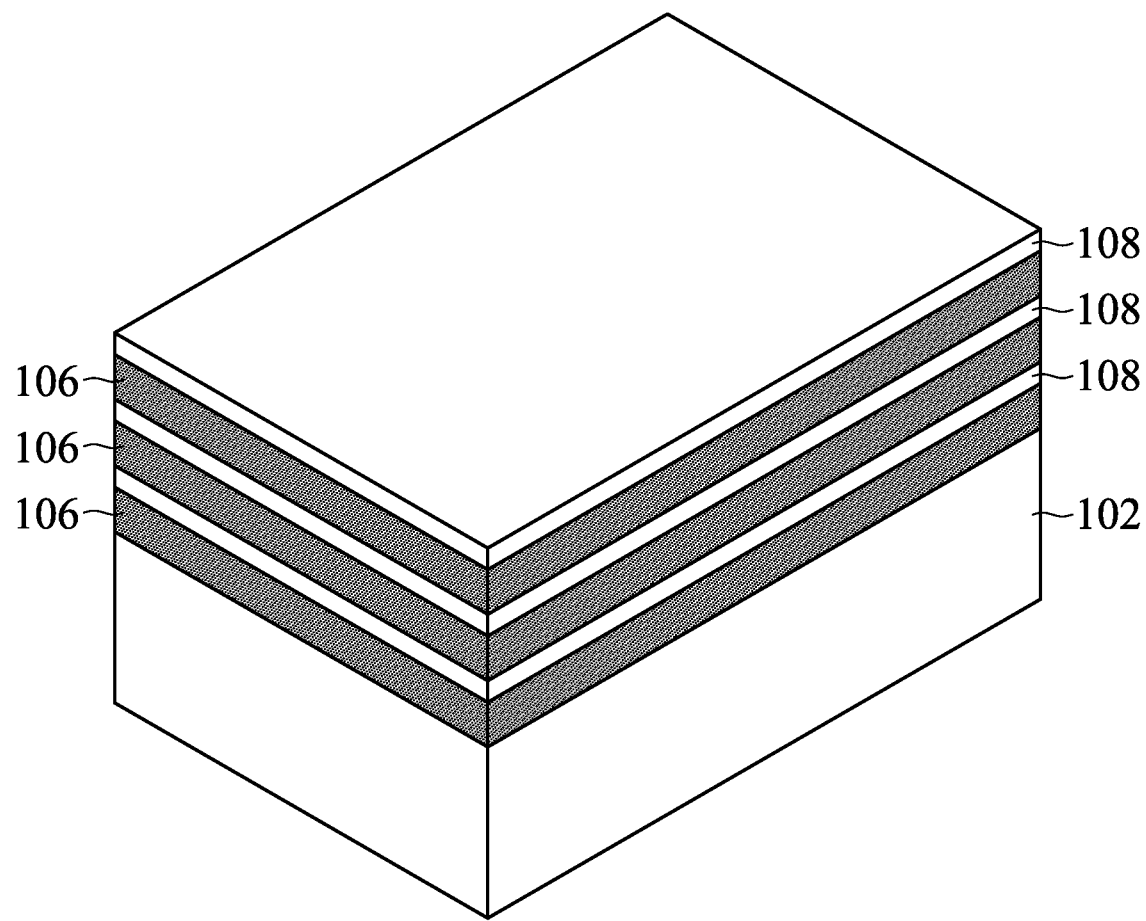
FIGS. 1A to 1E illustrate perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structures may include a gate structure formed over a substrate and a source/drain (S/D) structure formed adjacent to the gate structure. An S/D contact structure is formed over the S/D structure and a gate contact structure is directly formed on the gate structure without using a cap layer as a seed layer. Since no cap layer is formed before forming the gate contact structure, the quality of the gate contact structure is not affected by the quality of the cap layer. Therefore, a better quality of the gate contact structure is obtained to facilitate forming of a bridging contact structure in the subsequent step. A bridging contact structure is formed over the gate contact structure and the S/D contact structure to connect the S/D contact and the gate contact structure. The quality of the bridging contact structure is improved by forming the gate contact structure directly on the gate structure.

FIGS. 1A to 1E illustrate perspective views of intermediate stages of manufacturing a semiconductor structure 100a in accordance with some embodiments. As shown in FIG. 1A, first semiconductor material layers 106 and second semiconductor material layers 108 are formed over a substrate 102.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
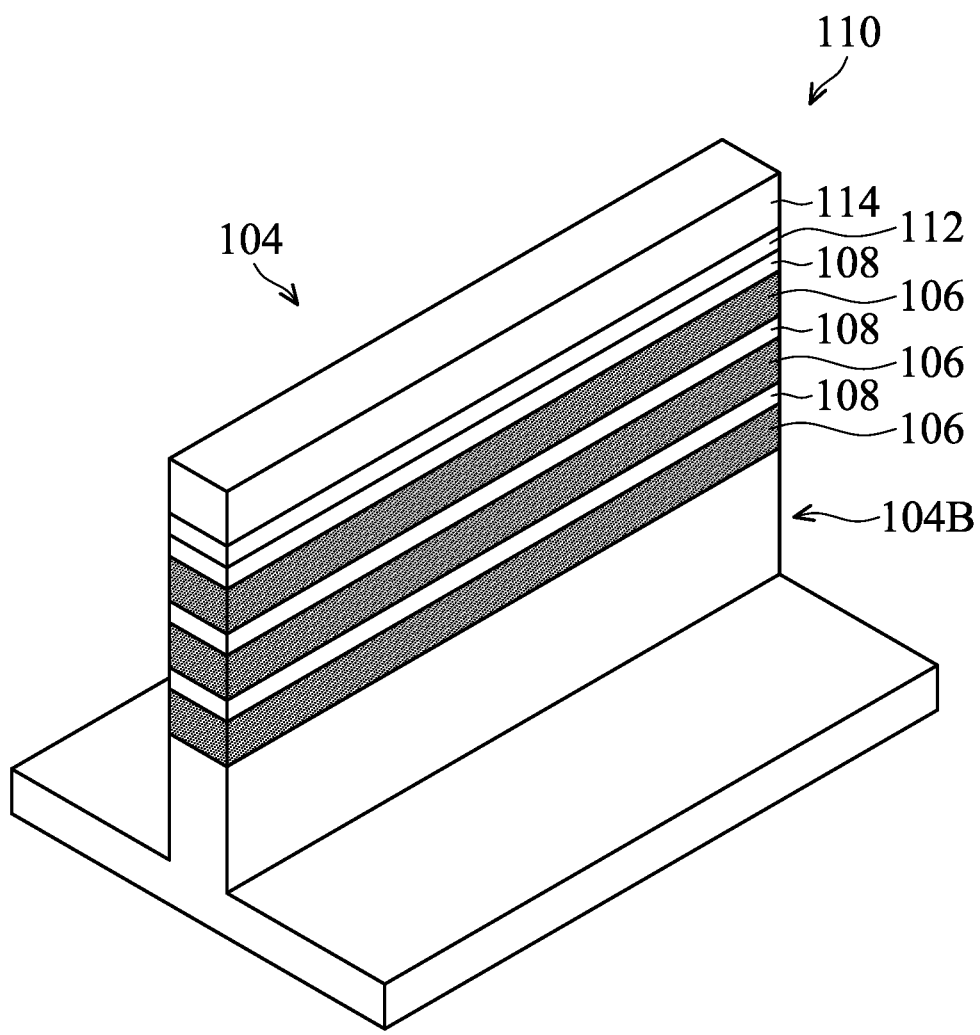

As shown in FIG. 1B, after the first semiconductor material layers 106 and the second semiconductor material layers 108 are formed as a semiconductor material stack over the substrate 102, the semiconductor material stack is patterned to form a fin structure 104, in accordance with some embodiments. In some embodiments, the fin structure 104 includes a base fin structure 104B and the semiconductor material stack of the first semiconductor material layers 106 and the second semiconductor material layers 108.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 112 and a nitride layer 114 formed over the pad oxide layer 112. The pad oxide layer 112 may be made of silicon oxide, which is formed by thermal oxidation or chemical vapor deposition (CVD), and the nitride layer 114 may be made of silicon nitride, which is formed by chemical vapor deposition (CVD), such as low-temperature chemical vapor deposition (LPCVD) or plasma-enhanced CVD (PECVD).

Figure 1C:
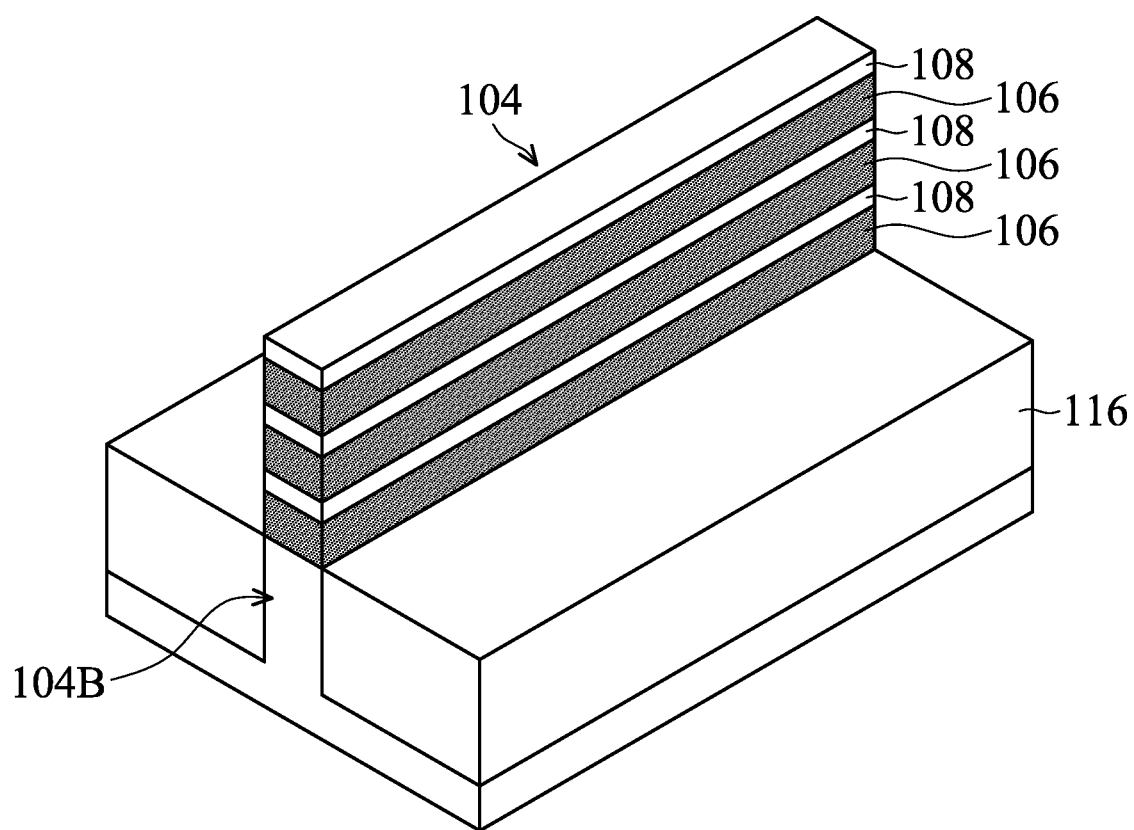

As shown in FIG. 1C, after the fin structure 104 is formed, an isolation structure 116 is formed around the fin structure 104, and the mask structure 110 is removed, in accordance with some embodiments. The isolation structure 116 is configured to electrically isolate active regions (e.g. the fin structure 104) of the semiconductor structure 100 and is also referred to as shallow trench isolation (STI) feature in accordance with some embodiments.

The isolation structure 116 may be formed by depositing an insulating layer over the substrate 102 and recessing the insulating layer so that the fin structure 104 is protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1D:
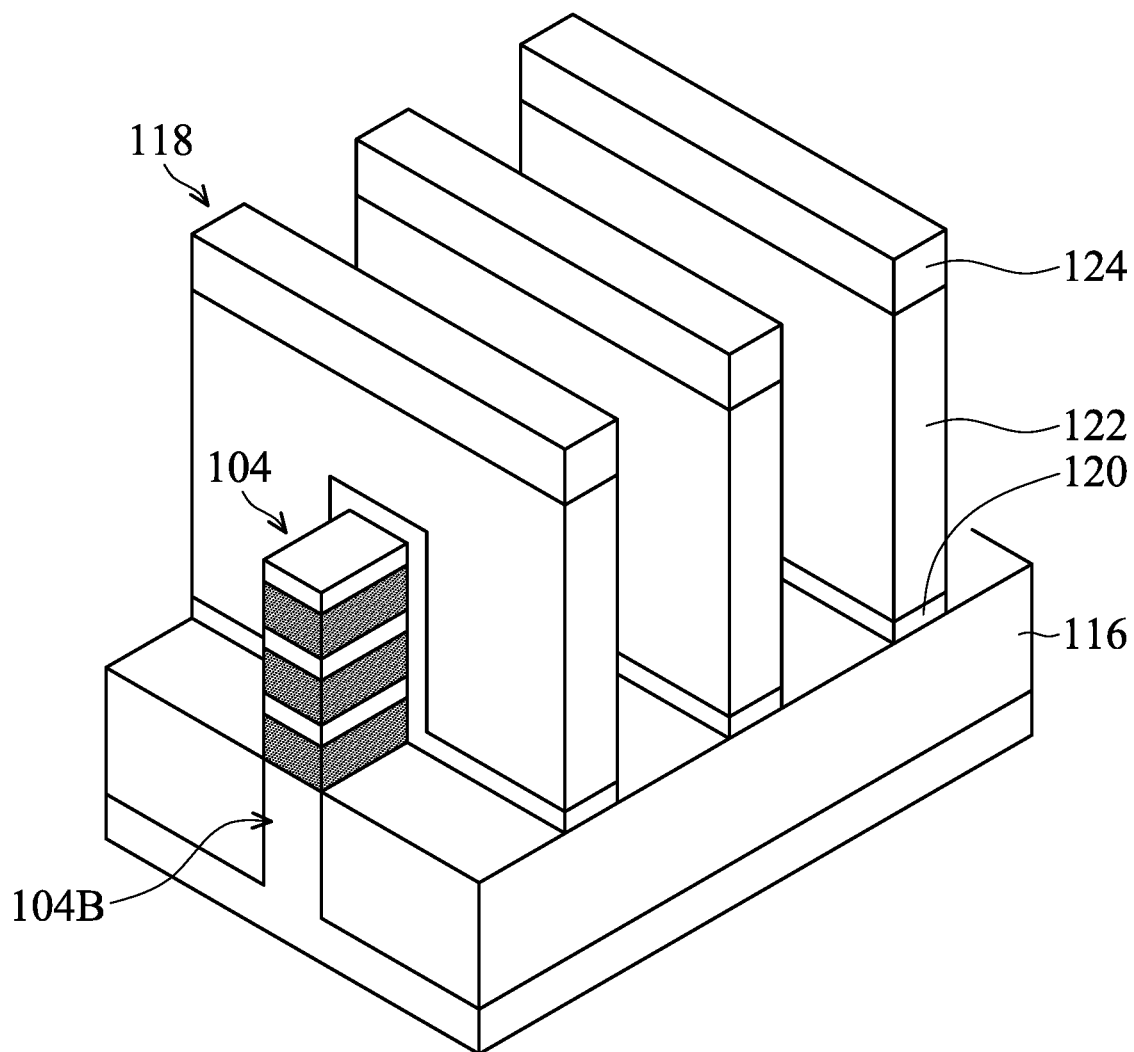

As shown in FIG. 1D, after the isolation structure 116 is formed, dummy gate structures 118 are formed across the fin structure 104 and extend over the isolation structure 116, in accordance with some embodiments. The dummy gate structures 118 may be used to define the source/drain regions and the channel regions of the resulting semiconductor structure 100.

In some embodiments, the dummy gate structures 118 include dummy gate dielectric layers 120 and dummy gate electrode layers 122. In some embodiments, the dummy gate dielectric layers 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 120 are formed using thermal oxidation, chemical vapor deposition (CVD), atomic vapor deposition (ALD), physical vapor deposition (PVD), another suitable method, or a combination thereof.

In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using chemical vapor deposition (CVD), physical vapor deposition (PVD), or a combination thereof.

In some embodiments, hard mask layers 124 are formed over the dummy gate structures 118. In some embodiments, the hard mask layers 124 include multiple layers, such as an oxide layer and a nitride layer. In some embodiments, the oxide layer is silicon oxide, and the nitride layer is silicon nitride.

The formation of the dummy gate structures 118 may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the dummy gate structures 118.

Figure 1E:
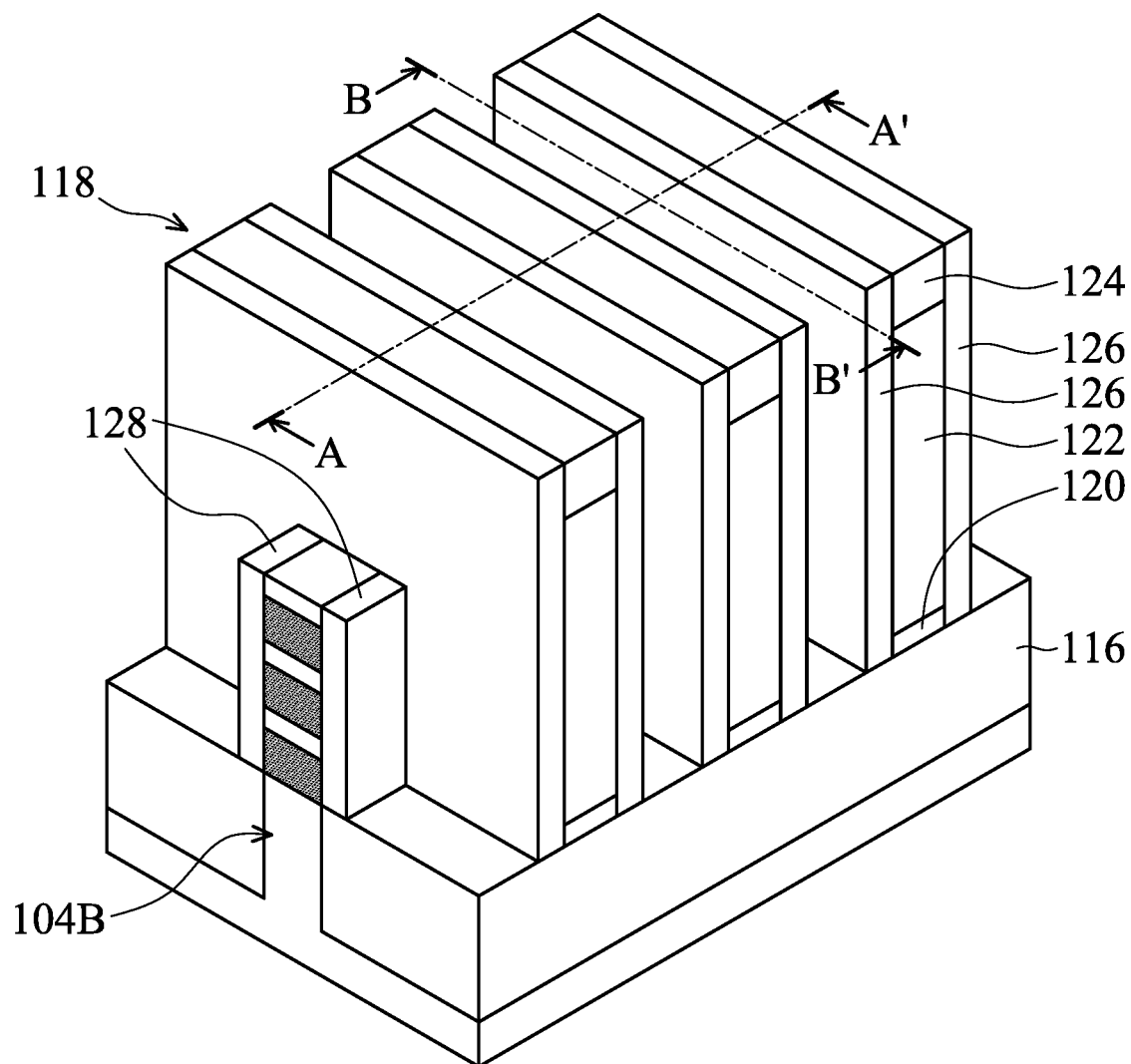

As shown in FIG. 1E, after the dummy gate structures 118 are formed, gate spacers 126 are formed along and covering opposite sidewalls of the dummy gate structure 118 and fin spacers 128 are formed along and covering opposite sidewalls of the source/drain regions of the fin structure 104, in accordance with some embodiments.

The gate spacers 126 may be configured to separate source/drain structures from the dummy gate structure 118 and support the dummy gate structure 118, and the fin spacers 128 may be configured to constrain a lateral growth of subsequently formed source/drain structure and support the fin structure 104.

In some embodiments, the gate spacers 126 and the fin spacers 128 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacers 126 and the fin spacers 128 may include conformally depositing a dielectric material covering the dummy gate structure 118, the fin structure 104, and the isolation structure 116 over the substrate 102, and performing an anisotropic etching process, such as dry plasma etching, to remove the dielectric layer covering the top surfaces of the dummy gate structure 118, the fin structure 104, and portions of the isolation structure 116.

Figures 2, 2A:
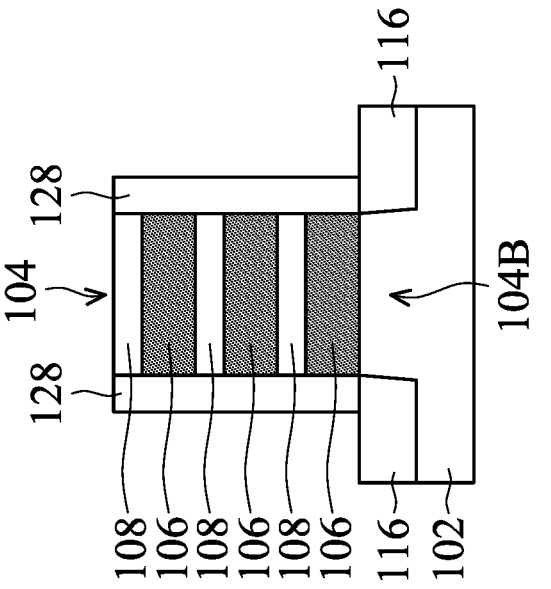
Figures 1, 2A:
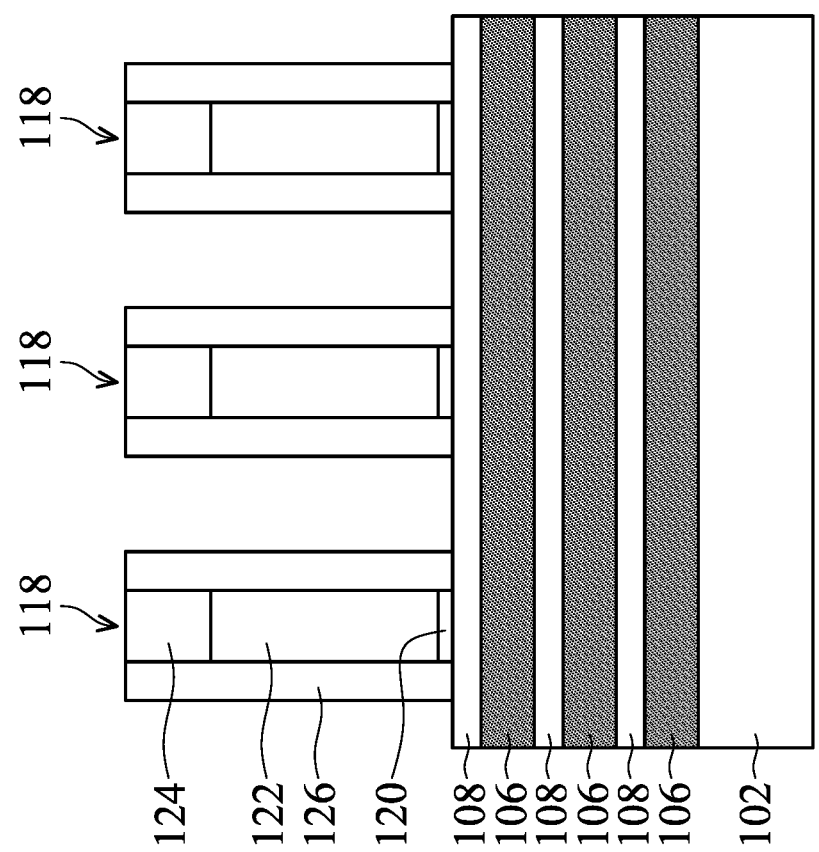
Figures 1, 2, 2C:
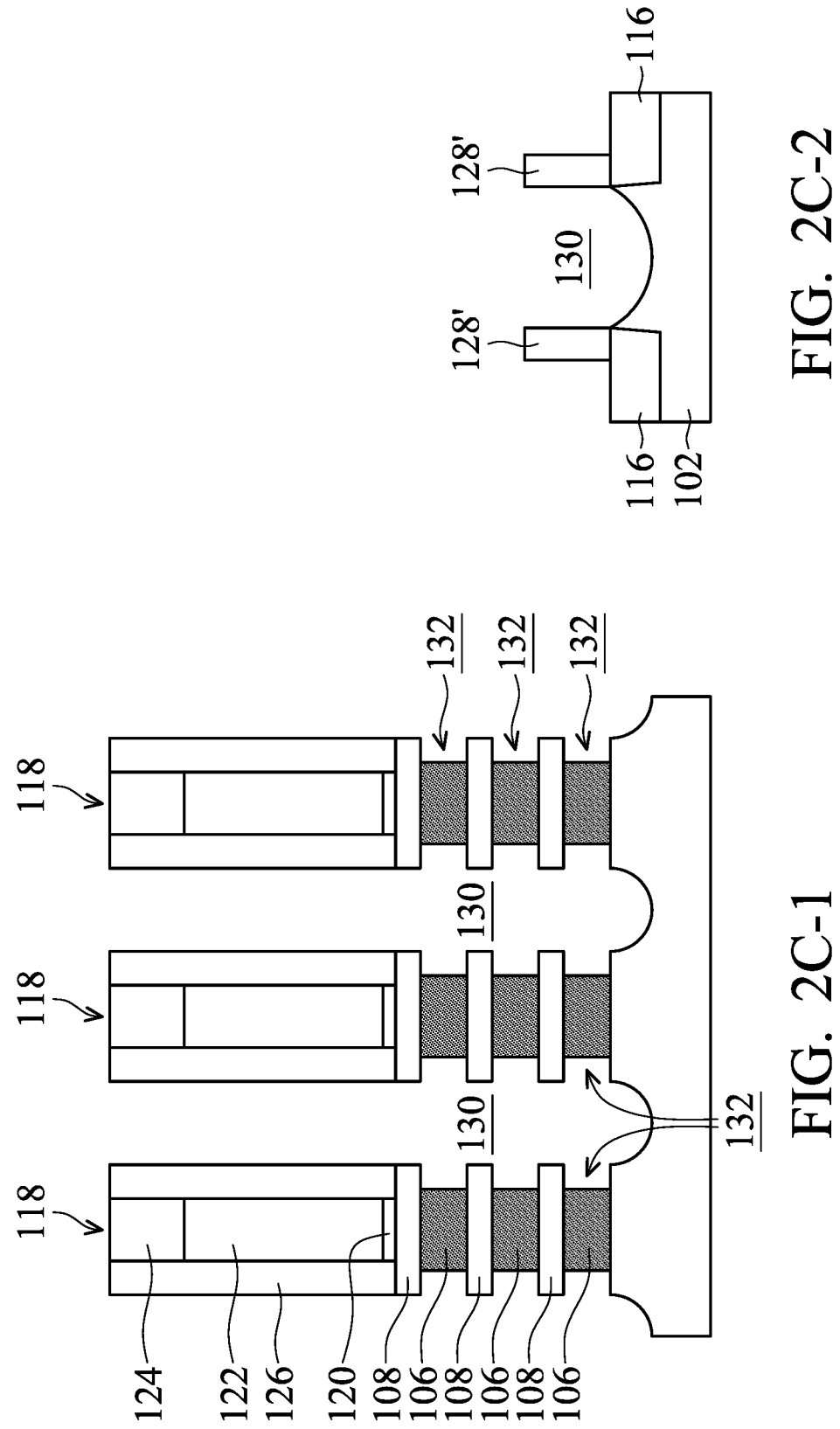
Figures 2, 2E:
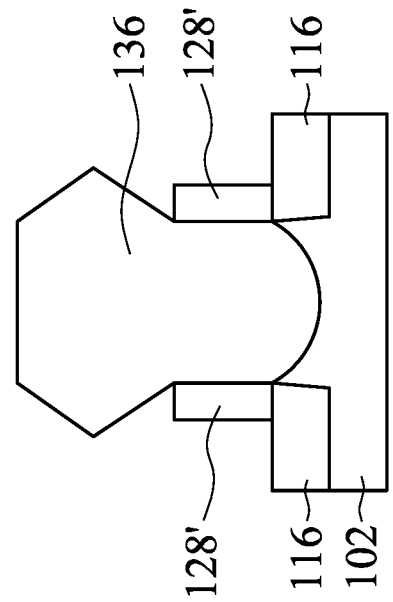
Figures 1, 2E:
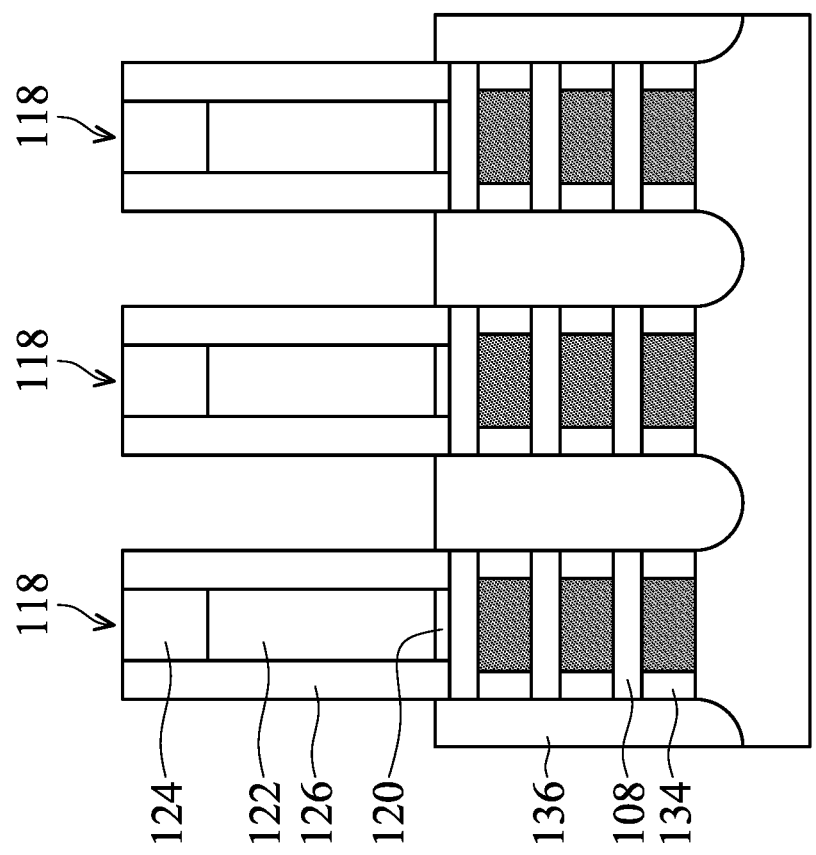
Figures 1, 2I:
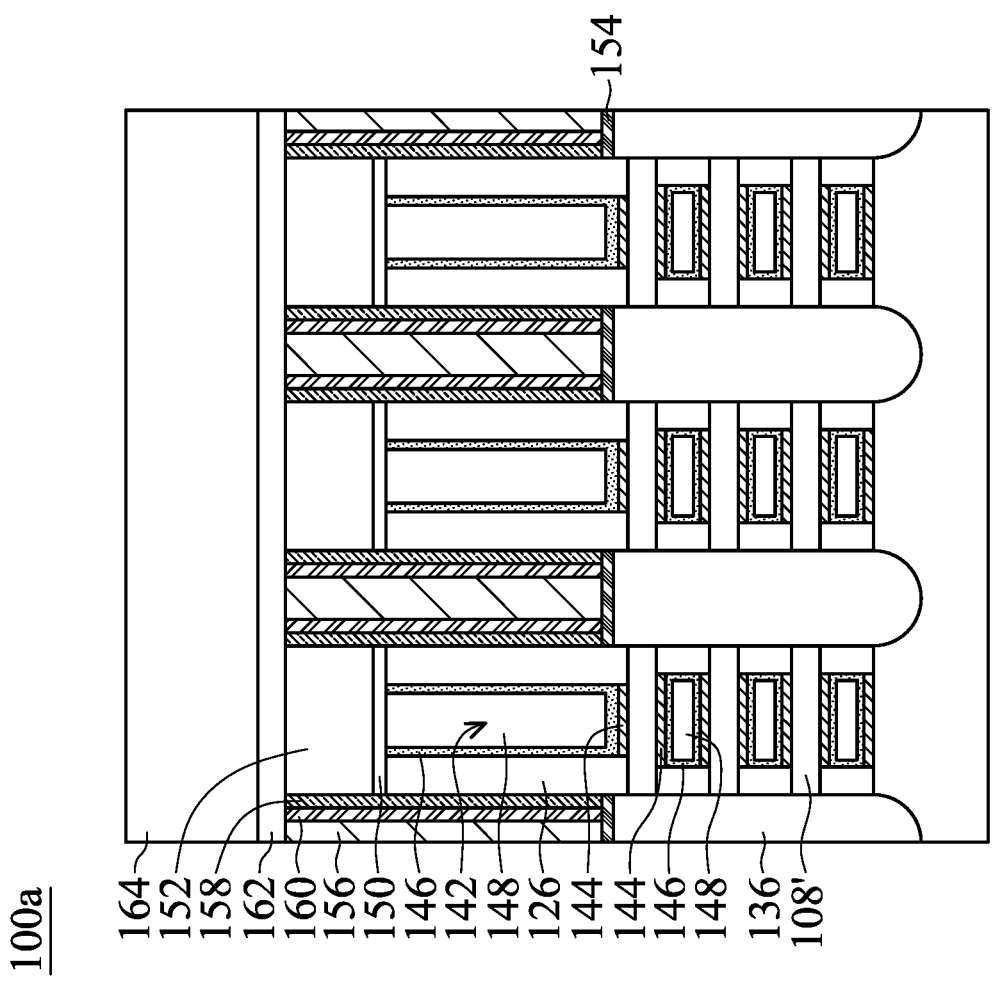
Figures 2, 2I:
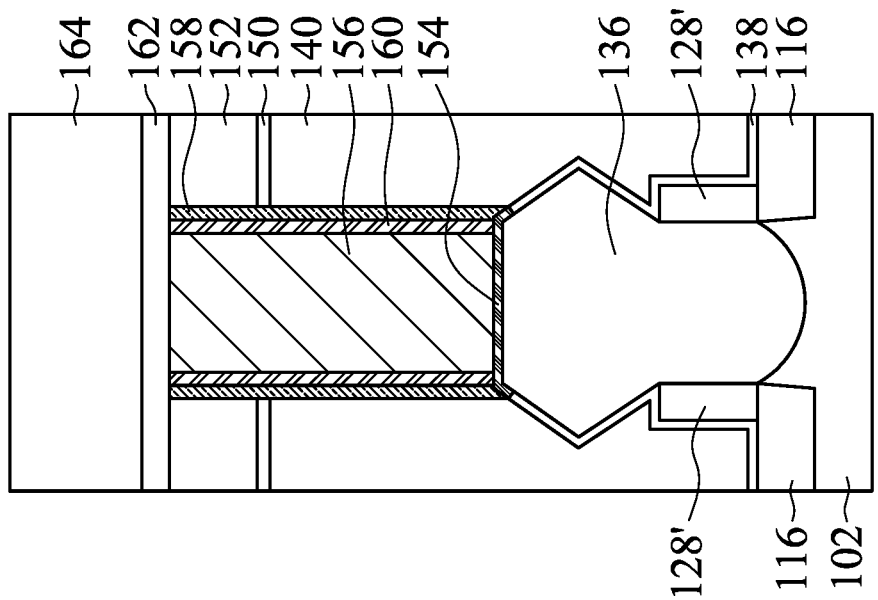
Figures 1, 2, 2M:
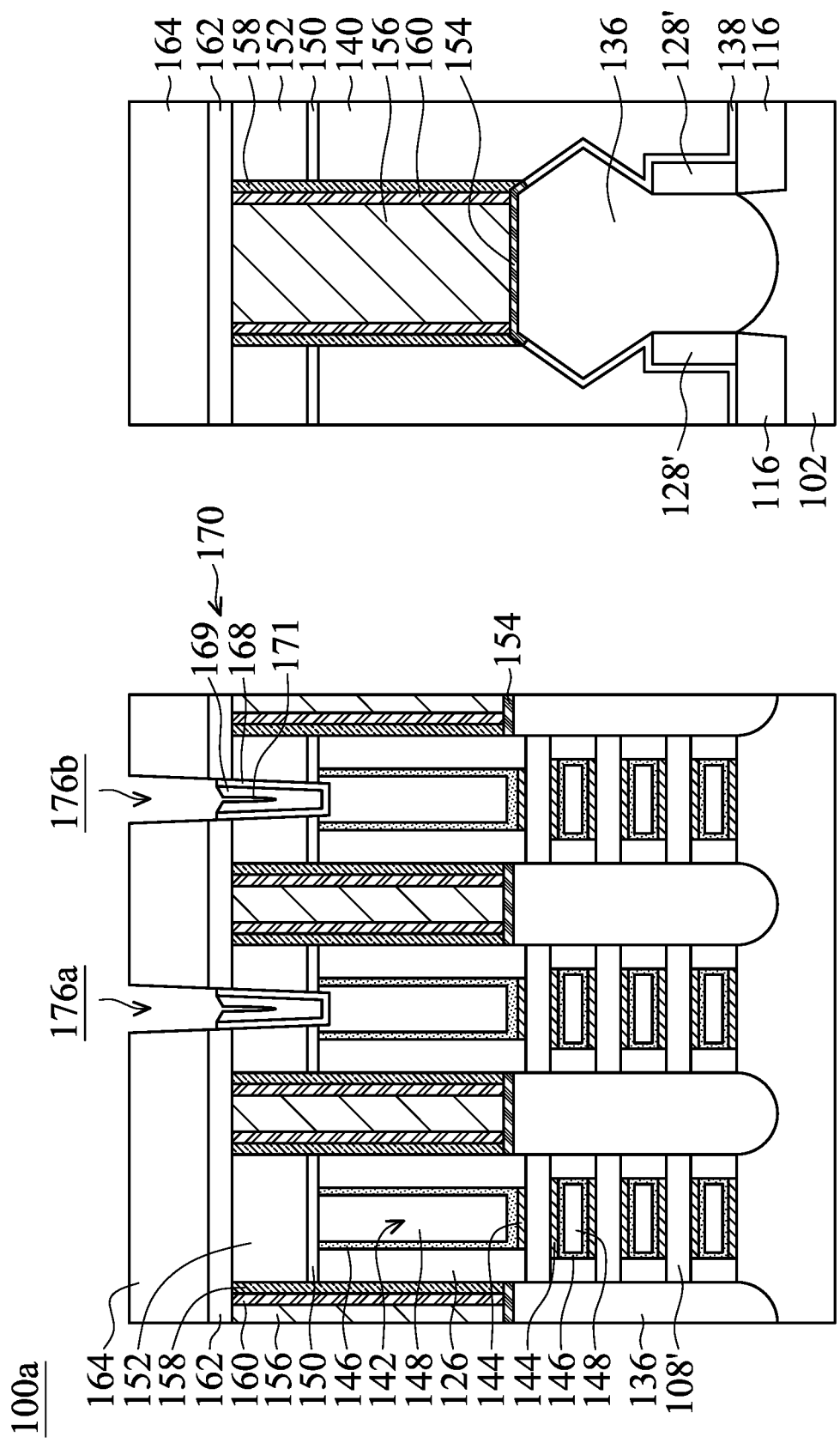
Figures 1, 2, 20:
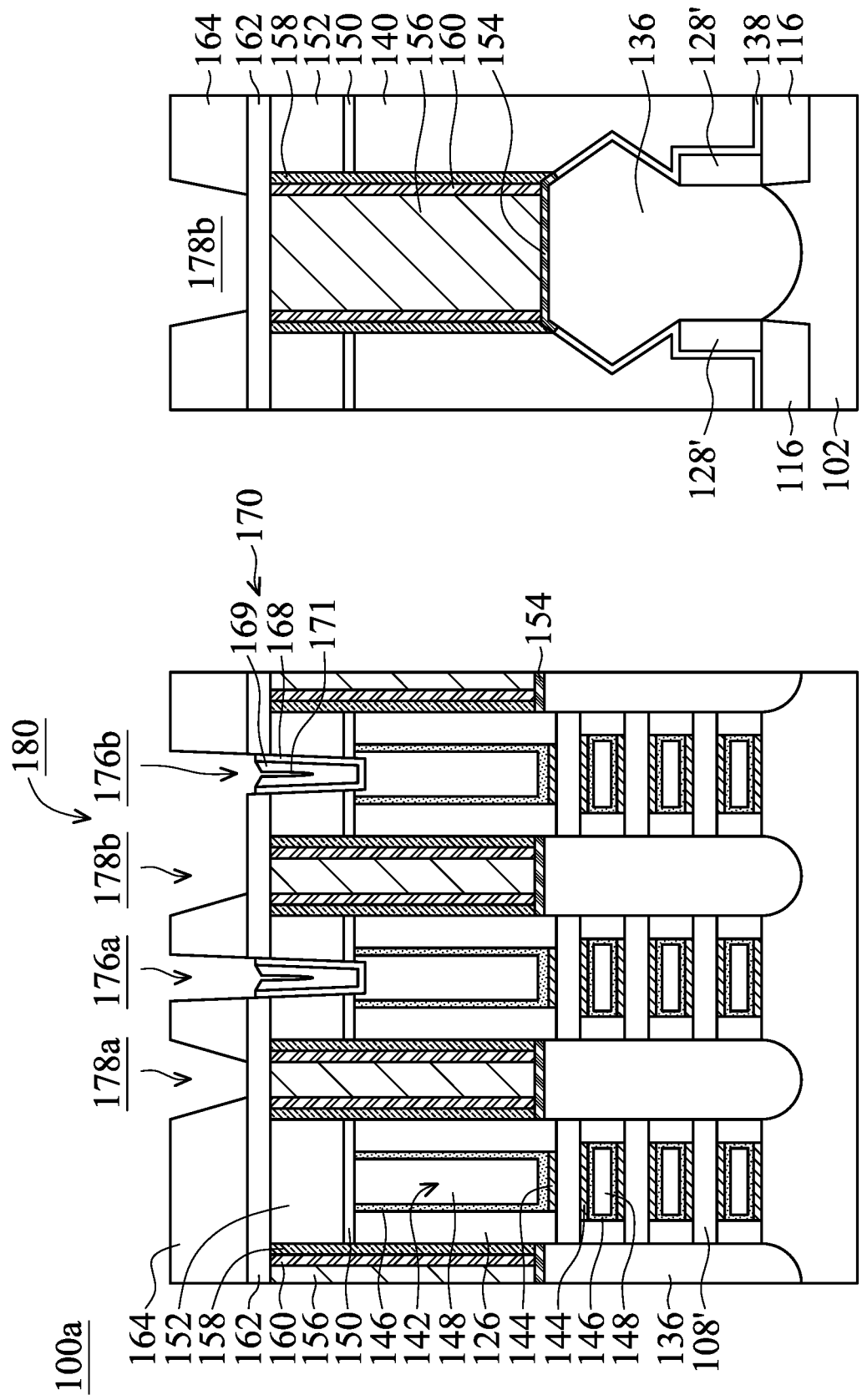
Figures 1, 2, 2P:
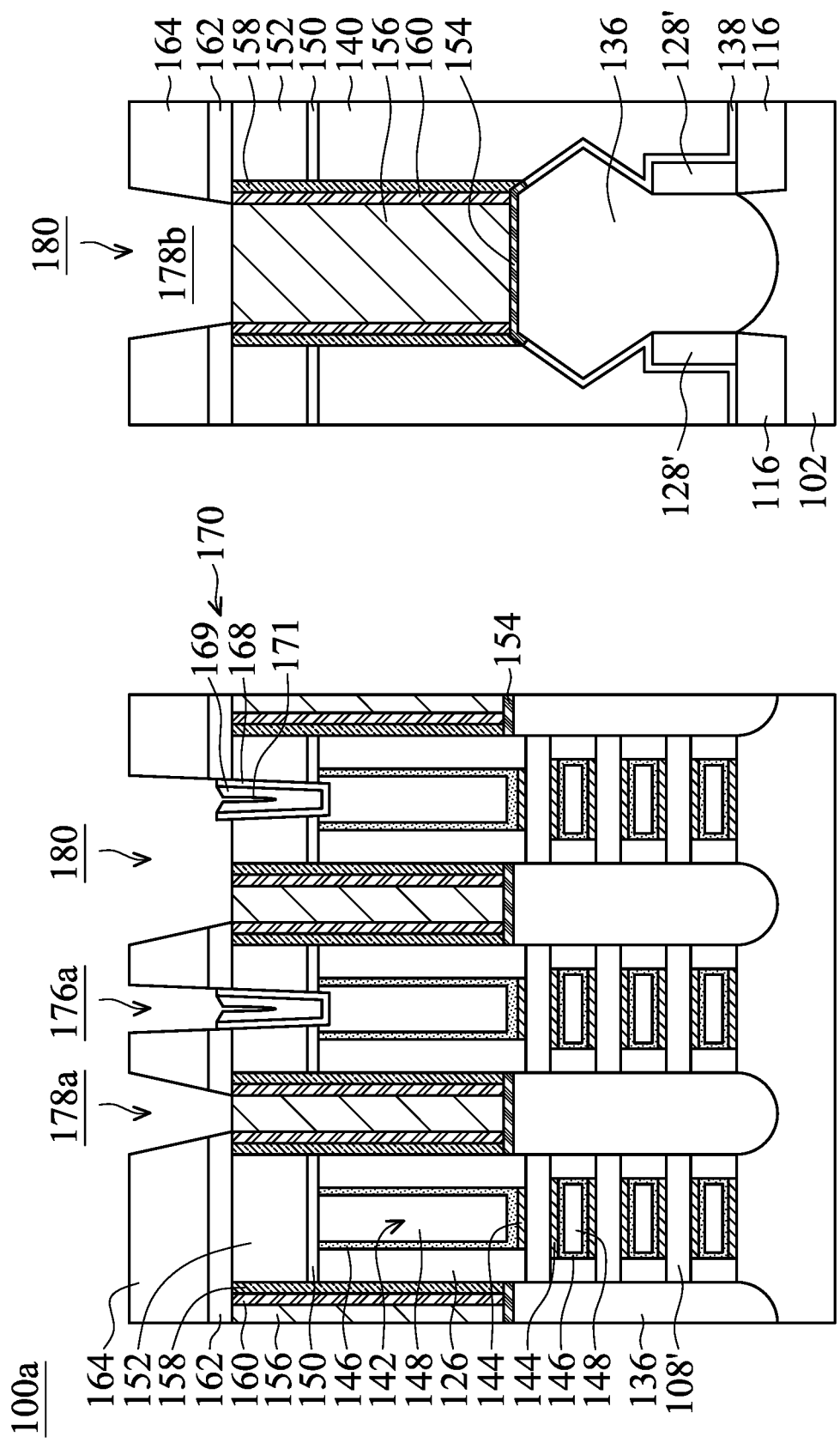
Figures 1, 2, 2Q:
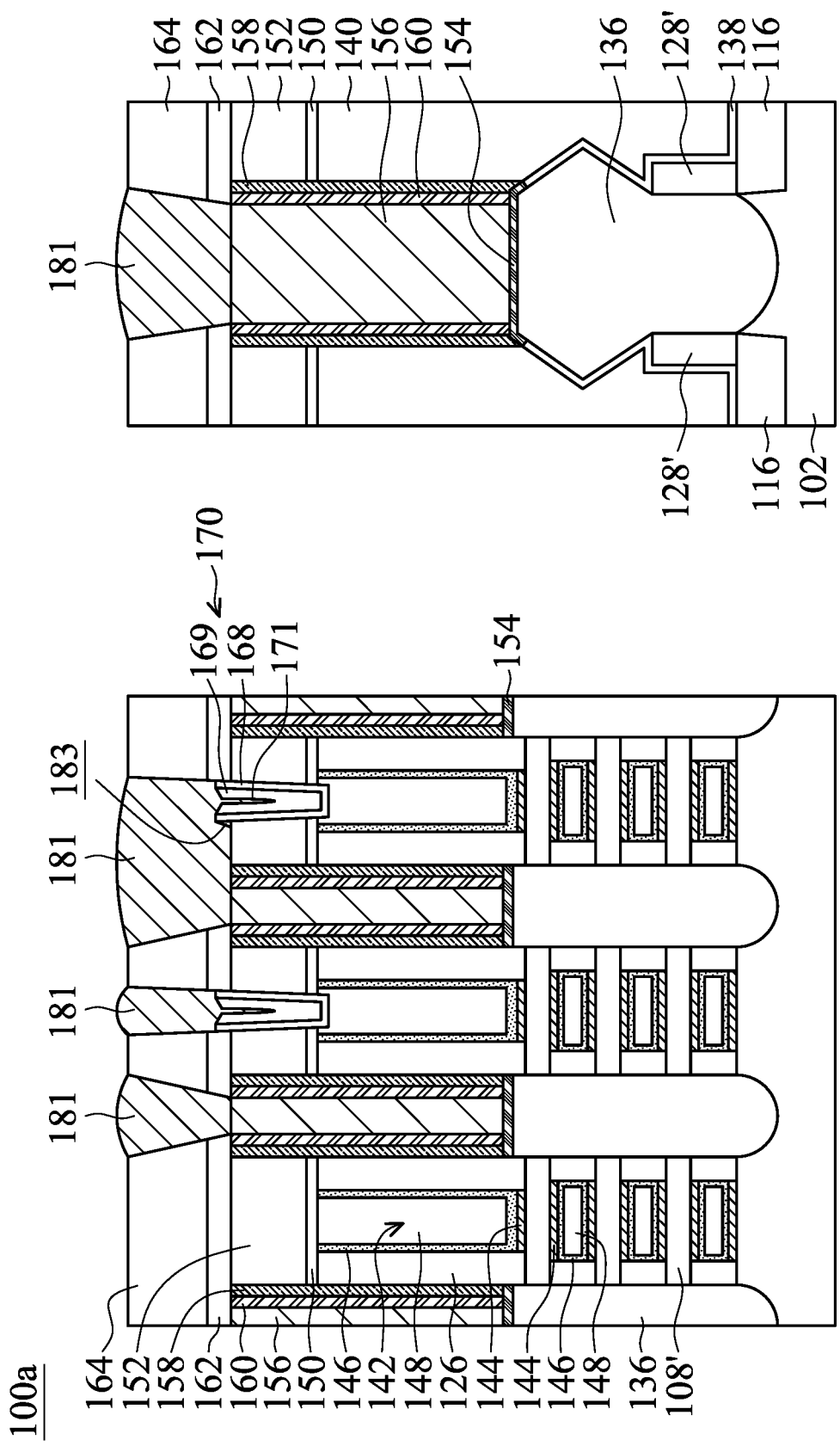
Figures 1, 2, 2R:
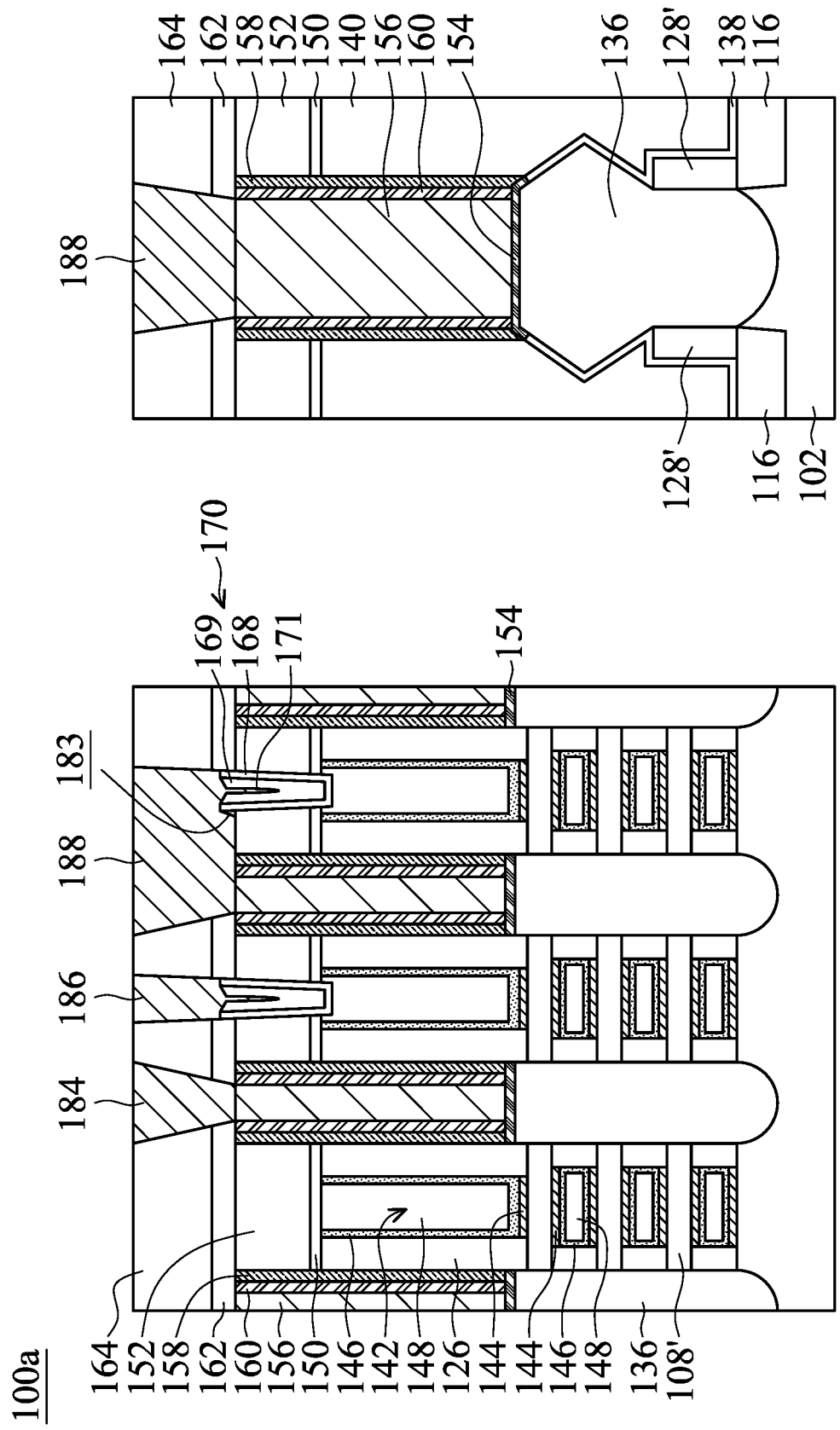

FIGS. 2A-1 to 2R-1 illustrate cross-sectional representations of various stages of manufacturing the semiconductor structure 100a shown along line A-A' in FIG. 1E in accordance with some embodiments. FIGS. 2A-2 to 2R-2 illustrate cross-sectional representations of various stages of manufacturing the semiconductor structure 100 shown along line B-B' in FIG. 1E in accordance with some embodiments. More specifically, FIG. 2A-1 illustrates the cross-sectional representation shown along line A-A' and FIG. 2A-2 illustrates the cross-sectional representation shown along line B-B' in FIG. 1E in accordance with some embodiments.

As shown in FIGS. 2B-1 and 2B-2, after the gate spacers 126 and the fin spacers 128 are formed, the source/drain (S/D) regions of the fin structure 104 are recessed to form source/drain (S/D) recesses 130, as shown in in accordance with some embodiments. More specifically, the first semiconductor material layers 106 and the second semiconductor material layers 108 not covered by the dummy gate structures 118 and the gate spacers 126 are removed in accordance with some embodiments. In addition, some portions of the base fin structure 104B are also recessed to form curved top surfaces, as shown in FIG. 2B-1 in accordance with some embodiments.

In some embodiments, the fin structure 104 is recessed by performing an etching process. The etching process may be an anisotropic etching process, such as dry plasma etching, and the dummy gate structure 118 and the gate spacers 126 are used as etching masks during the etching process. In some embodiments, the fin spacers 128 are also recessed to form lowered fin spacers 128'.

Afterwards, as shown in FIGS. 2C-1 and 2C-2, after the source/drain recesses 130 are formed, the first semiconductor material layers 106 exposed by the source/drain recesses 130 are laterally recessed to form notches 132, in accordance with some embodiments.

In some embodiments, an etching process is performed on the semiconductor structure 100 to laterally recess the first semiconductor material layers 106 of the fin structure 104 from the source/drain recesses 130. In some embodiments, during the etching process, the first semiconductor material layers 106 have a greater etching rate (or etching amount) than the second semiconductor material layers 108, thereby forming notches 132 between adjacent second semiconductor material layers 108. In some embodiments, the etching process is an isotropic etching such as dry chemical etching, remote plasma etching, wet chemical etching, another suitable technique, and/or a combination thereof.

Next, as shown in FIGS. 2D-1 and 2D-2, inner spacers 134 are formed in the notches 132 between the second semiconductor material layers 108, in accordance with some embodiments. The inner spacers 134 are configured to separate the source/drain structures and the gate structures formed in subsequent manufacturing processes in accordance with some embodiments. In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacer layer 134 is formed by a deposition process, such as chemical vapor deposition (CVD) process, atomic layer deposition (ALD) process, another applicable process, or a combination thereof.

Afterwards, as shown in FIGS. 2E-1 and 2E-2, after the inner spacers 134 are formed, source/drain (S/D) structures 136 are formed in the S/D recesses 130, in accordance with some embodiments. In some embodiments, the S/D structures 136 are formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof. In some embodiments, the S/D structures 136 are made of any applicable material, such as Ge, Si, GaAs, AlGaAs, SiGe, GaAsP, SiP, SiC, SiCP, or a combination thereof.

In some embodiments, the S/D structures 136 are in-situ doped during the epitaxial growth process. For example, the S/D structures 136 may be the epitaxially grown SiGe doped with boron (B). For example, the S/D structures 136 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the S/D structures 136 are doped in one or more implantation processes after the epitaxial growth process.

Next, as shown in FIGS. 2F-1 and 2F-2, after the S/D structures 136 are formed, a contact etch stop layer (CESL) 138 is conformally formed to cover the S/D structures 136 and an interlayer dielectric (ILD) layer 140 is formed over the contact etch stop layers 138, in accordance with some embodiments.

In some embodiments, the contact etch stop layer 138 is made of a dielectric materials, such as silicon nitride, silicon oxide, silicon oxynitride, another suitable dielectric material, or a combination thereof. The dielectric material for the contact etch stop layers 138 may be conformally deposited over the semiconductor structure by performing chemical vapor deposition (CVD), ALD, other application methods, or a combination thereof.

The ILD layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 140 may be formed by chemical vapor deposition (CVD), physical vapor deposition, (PVD), atomic layer deposition (ALD), or other applicable processes.

After the contact etch stop layer 138 and the ILD layer 140 are deposited, a planarization process such as CMP or an etch-back process may be performed until the gate electrode layers 120 of the dummy gate structures 118 are exposed, as shown in FIG. 2F-1 in accordance with some embodiments.

Afterwards, as shown in FIGS. 2G-1 and 2G-2, the dummy gate structures 118 are replaced by a gate structure 142, in accordance with some embodiments. More specifically, the dummy gate structures 118 and the first semiconductor material layers 106 are removed to form nanostructures 108' with the second semiconductor material layers 108, in accordance with some embodiments. The S/D structure 136 is attached to the nanostructures 108'.

The removal process may include one or more etching processes. For example, when the dummy gate electrode layers 122 are polysilicon, a wet etchant such as a tetramethylammonium hydroxide (TMAH) solution may be used to selectively remove the dummy gate electrode layers 122. Afterwards, the dummy gate dielectric layers 120 may be removed using a plasma dry etching, a dry chemical etching, and/or a wet etching. The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions. In some embodiments, the upper portions of the gate spacers 126 are also removed.

After the nanostructures 108' are formed, the gate structures 142 are formed wrapped around the nanostructures 108'. The gate structures 142 wrap around the nanostructures 108' to form gate-all-around transistor structures in accordance with some embodiments. In some embodiments, the gate structure 142 includes an interfacial layer 144, a gate dielectric layer 146, and a gate electrode layer 148.

In some embodiments, the interfacial layers 144 are oxide layers formed around the nanostructures 108' and on the top of the base fin structure 104B. In some embodiments, the interfacial layers 144 are formed by performing a thermal process.

In some embodiments, the gate dielectric layers 146 are formed over the interfacial layers 144, so that the nanostructures 108' are surrounded (e.g. wrapped) by the gate dielectric layers 146. In addition, the gate dielectric layers 146 also cover the sidewalls of the gate spacers 126 and the inner spacers 134 in accordance with some embodiments. In some embodiments, the gate dielectric layers 146 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_1$—$Al2O_3$) alloy, another suitable high-k dielectric material, or a combination thereof. In some embodiments, the gate dielectric layers 146 are formed using chemical vapor deposition (CVD), atomic layer deposition (ALD), another applicable method, or a combination thereof.

In some embodiments, the gate electrode layers 148 are formed on the gate dielectric layer 146. In some embodiments, the gate electrode layers 148 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 148 are formed using chemical vapor deposition (CVD), atomic layer deposition (ALD), electroplating, another applicable method, or a combination thereof. Other conductive layers, such as work function metal layers, may also be formed in the gate structures 142, although they are not shown in the figures. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

After the interfacial layers 144, the gate dielectric layers 146, and the gate electrode layers 148 are formed, a planarization process such as CMP or an etch-back process may be performed until the ILD layer 140 is exposed.

Afterwards, as shown in FIGS. 2H-1 and 2H-2, an etch stop layer 150 is formed over the gate structure 142, and a dielectric layer 152 is formed over the etch stop layer 150, in accordance with some embodiments. Next, S/D contact structures 156 are formed over the S/D structures 136.

In some embodiments, the contact openings may be formed through the contact etch stop layer 138, the interlayer dielectric layer 140, the etch stop layer 150 and the dielectric layer 152 to expose the top surfaces of the S/D structures 136, and the silicide layers 154 and the S/D contact structure 156 may be formed in the contact openings. The contact openings may be formed using a photolithography process and an etching process. In addition, some portions of the S/D structures 136 exposed by the contact openings may also be etched during the etching process.

After the contact openings are formed, the silicide layers 154 may be formed by forming a metal layer over the top surface of the S/D structures 136 and annealing the metal layer so the metal layer reacts with the S/D structures 136 to form the silicide layers 154. The unreacted metal layer may be removed after the silicide layers 154 are formed.

Afterwards, the liners 158, the barrier layers 160, and the S/D contact structure 156 are formed over the silicide layers 154 in the contact openings and a polishing process is performed. As shown in FIG. 2H-1, the top surface of the S/D contact structure 156 is substantially level with the top surface of the dielectric layer 152, in accordance with some embodiments.

In some embodiments, the etch stop layer 150 is made of a dielectric materials, such as silicon nitride, silicon oxide, silicon oxynitride, another suitable dielectric material, or a combination thereof. The dielectric material for the etch stop layers 150 may be conformally deposited over the semiconductor structure by performing chemical vapor deposition (CVD), atomic layer deposition (ALD), other application methods, or a combination thereof.

In some embodiments, the dielectric layer 152 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 152 may be formed by chemical vapor deposition (CVD), physical vapor deposition, (PVD), atomic layer deposition (ALD), or other applicable processes In some embodiments, the S/D contact structure 156 are made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. In some embodiments, the liner 158 is made of silicon nitride, although any other applicable dielectric may be used as an alternative. In some embodiments, the barrier layer 160 is made of tantalum nitride, although other materials, such as tantalum, titanium, titanium nitride, or the like, may also be used. The liners 158, the barrier layers 160, and the S/D contact structure 156 may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

In some embodiments, the top surface of the S/D contact structure 156 is higher than the top surface of the gate structure 142 and is substantially level with the dielectric layer 152. In some embodiments, the height difference between the S/D contact structure 156 and the gate structure 142 is substantially level with the height of the dielectric layer 152.

Next, as shown in FIGS. 2I-1 and 2I-2, after the S/D contact structure 156 are formed, an etch stop layer 162 is formed over the S/D contact structure 156 and the mask layers 152, and a dielectric layer 164 is formed over the etch stop layer 162, in accordance with some embodiments.

In some embodiments, the etch stop layer 162 is made of a dielectric materials, such as silicon nitride, silicon oxide, silicon oxynitride, another suitable dielectric material, or a combination thereof. The dielectric material for the contact etch stop layers 162 may be conformally deposited over the semiconductor structure by performing chemical vapor deposition (CVD), atomic layer deposition (ALD), other application methods, or a combination thereof.

The dielectric layer 164 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 164 may be formed by chemical vapor deposition (CVD), physical vapor deposition, (PVD), atomic layer deposition (ALD), or other applicable processes.

Afterwards, as shown in FIGS. 2J-1 and 2J-2, after the dielectric layer 164 is formed, trenches 166 are formed through the etch stop layer 150, the dielectric layer 152, the etch stop layer 162, and the dielectric layer 164, in accordance with some embodiments. As a result, top surfaces of the gate structure 142 are exposed. The first trench 166 may be formed by performing one or more etching processes, including dry etching processes and/or wet etching processes.

In some embodiments, a portion of the gate structure 142 is removed, and the top surface of the gate structure 142 is curved. More specifically, the trench 166 extends into the gate structure 142, and the bottom surface of the trench 166 is lower than the top surface of the ILD layer 140.

Next, as shown in FIGS. 2K-1 and 2K-2, a barrier layer 168 and a conductive layer 169 are formed in the each of the trenches 166, in accordance with some embodiments. Since the trench 166 extends into the gate electrode layer 148, a portion of the barrier layer 168 and a portion of the conductive layer 169 are lower than top surface of the ILD layer 140.

In some embodiments, the barrier layer 168 is made of titanium (Ti), titanium nitride (TiN), tantalum (Ta), tantalum nitride (TaN), or another applicable material. In some embodiments, the barrier layer 168 is formed by using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

In some embodiments, the conductive layer 169 is tungsten (W), ruthenium (Ru), molybdenum (Mo), or the like. In some embodiments, the conductive layer 169 is formed by performing a deposition process, such as chemical vapor deposition (CVD), physical vapor deposition, (PVD), atomic layer deposition (ALD), or other applicable processes.

In some embodiments, a void 171 is formed in the conductive layer 169 when the gap filling ability of the material for forming the conductive layer 169 is not good enough during the deposition process.

Afterward, as shown in FIGS. 2L-1 and 2L-2, a polishing process is performed to form a gate contact structure 170 in the first trench 166 over the gate structure 142, in accordance with some embodiments. The gate contact structure 170 is landing on the gate structure 142.

In a compared embodiment, a cap layer is formed on the gate structure, and the gate contact structure is formed on the cap layer using a bottom up deposition process, wherein the quality of the gate contact structure is determined by the quality of the cap layer. Since the quality of the cap layer is not easy to control, the quality of the gate contact structure may be poor. In order to prevent the above issue from occurring due to the poor quality of the cap layer, the gate contact structure 170 of this disclosure is formed directly on the gate structure 142 without using any cap layer. The barrier layer 168 of the gate contact structure 170 is in direct contact with the gate electrode layer 148 of the gate structure 142. In some embodiments, no cap layer or additional layer is between the barrier layer 168 of the gate contact structure 170 and the gate electrode layer 148 of the gate structure 170.

In some embodiments, a CMP process is performed to polish the conductive material 169 so that the top surface of the gate contact structure 170 is substantially level with the top surface of the dielectric layer 164. Since the trench 166 extends into the gate structure 142, a portion of the gate contact structure 170 is lower than the top surface of the IDL layer 140. In addition, a portion of the gate contact structure 170 is lower than the topmost surface of the gate structure 140.

Next, as shown in FIGS. 2M-1 and 2M-2, the gate contact structure 170 is shortened to form a shortened gate contact structure 170, in accordance with some embodiments. More specifically, the top portion of the gate contact structure 170 is etched back, so that the top surface of the shorted conductive structure 171 is substantially level with the top surface of the etch stop layer 162. In addition, trenches 176a/176b are formed above the shortened gate contact structure 170. The voids 171 are exposed by the trenches 176a/176b. The trenches 176a/176b are directly above the gate structure 142.

In some embodiments, there is a first distance $D_1$ between the top surface of the shortened gate contact structure 170 and the top surface of the etch stop layer 162. In some embodiments, the first distance $D_1$ is about 0.1 to about 5 nm. In some embodiments, the top surface of the shortened gate contact structure 170 is higher than the top surface of the etch stop layer 162 about 0.1 to about 5 nm. In some other embodiments, the top surface of the shortened gate contact structure 170 is lower than the top surface of the etch stop layer 162 about 0.1 to about 5 nm. In some embodiments, the bottom surface of the etch stop layer 162 is lower than the top surface of the shortened gate contact structure 170. The top surface of the shortened gate contact structure 170 is lower than the top surface of the etch stop layer 162 and higher than the bottom surface of the etch stop layer 162.

Afterwards, as shown in FIGS. 2N-1 and 2N-2, a first portion of the dielectric layer 164 directly above the S/D contact structure 156 is removed to form a trench 178a, in accordance with some embodiments. As a result, the top surface of the etch stop layer 162 is exposed by the trench 147.

Next, as shown in FIGS. 2O-1 and 2O-2, a second portion of the dielectric layer 164 directly above another S/D contact structure 156 is removed to form a trench 178b, in accordance with some embodiments.

It should be noted that the trench 178b is connected to the trench 176b to form a combined trench 180. The top surface of the S/D contact structure 156 and the top surface of the shortened gate contact structure 170 are exposed by the combined trench 18. In contrast to the combined trench 180, the trench 178a is separated from the trench 176a.

Afterwards, as shown in FIGS. 2P-1 and 2P-2, a portion of the etch stop layer 162 is removed to expose the top surface of the S/D contact structure 156, in accordance with some embodiments. As a result, the top surface of one of the S/D contact structures 156 is exposed by the trench 178a, and the top surface of another S/D contact structure 156 is exposed by the combined trench 180. In addition, the top surface of one of the shortened gate contact structures 170 is exposed by the trench 176a, and the top surface of another the shortened gate contact structures 170 is exposed by the combined trench 180.

Afterwards, as shown in FIGS. 2Q-1 and 2Q-2, a conductive material 181 is formed in the trench 178a, the trench 176a and the combined trench 180, in accordance with some embodiments.

In some embodiments, the conductive material 181 is formed by performing a bottom-up deposition process. The bottom-up deposition process generally refers to a deposition process that fills an opening from bottom to top. By using the bottom-up deposition process, the trench 178a, the trench 176a and the combined trench 180 may be filled without any air gaps. In some embodiments, the bottom-up deposition process is a selective CVD process that the conductive material 181 is selectively deposited over the S/D contact structure 156 and the shortened gate contact structure 170.

In some embodiments, the conductive layer 181 is made of tungsten (W), ruthenium (Ru), molybdenum (Mo), copper (Cu) or another applicable material. In some embodiments, the conductive material 168 is Ru, and a precursor gas used in the bottom-up deposition process includes $Ru(CO)_5$, $Ru_3(CO)_{12}$, $RuCl_3$, $Ru(od)_3$, Bis(cyclopentadienyl)ruthenium(II), $Ru(CO)_3C_6H_8$, $Ru(CO)_2(tmhd)_2$, $Ru(EtCp)_2$, $Ru(CO)_2(acac)_2$, $Ru(C_6H_6)(C_6H_8)$, $Ru(DMBD)(CO)_3$, a combination thereof, or the like. In some embodiments, the conductive material 168 is W, and a precursor gas used in the bottom-up deposition process includes $W(CO)_6$, $W(F)_6$, or the like. In some embodiments, the conductive material 168 is Mo, and a precursor gas used in the bottom-up deposition process includes $MoF_6$, $Mo(CO)_6$, $MoCl_5$, $MoO_xCl_y$, or the like.

Since the shortened conductive structure 170 is formed first, the height difference of different regions of the combined trench 180 (e.g. the region over the S/D contact structure 156 and the region over the gate structure 142) can be relatively small. Accordingly, the conductive material 181 can be formed using a bottom-up deposition process with improved connection between the S/D contact structure 156 and the gate structure 142.

Next, as shown in FIGS. 2R-1 and 2R-2, a polishing process is performed to form an S/D conductive plug 184, a gate conductive plug 186, and a bridging contact structure 188 in the trench 178a, the trench 176a and the combined trench 180, in accordance with some embodiments. The bridging contact structure 188 is in direct contact with the gate contact structure 170 and the S/D contact structure 156. More specifically, the S/D contact structure 156 is connected to the shorted gate contact structure 170 by the bridging contact structure 188.

In some embodiments, a CMP process is performed to polish the conductive material 181 so that the top surface of the S/D conductive plug 184, the top surface of the gate conductive plug 186, and the top surface of the bridging contact structure 188 are substantially level with the top surface of the dielectric layer 164.

The bridging contact structure 188 has a first portion directly above the S/D contact structure 156, a second portion directly above the dielectric layer 152 and a third portion directly above the gate contact structure 170. More specifically, the first portion of the bridging contact structure 188 is in direct contact with the S/D contact structure 156, the second portion of the bridging contact structure 188 is in direct contact with the dielectric layer 152, and the third portion of the bridging contact structure 188 is in direct contact with the barrier layer 168 and the conductive layer 169 of the gate contact structure 170. In some embodiments, the bridging contact structure 188 and the S/D contact structure 156 are made of different materials, and the interface between the bridging contact structure 188 and the S/D contact structure 156 is substantially coplanar with the top surface of the dielectric layer 152. In other words, the interface between the bridging contact structure 188 and the S/D contact structure 156 is substantially coplanar with the bottom surface of the etch stop layer 162.

Since the bridging contact structure 188 is formed by the bottom-up deposition process, the bridging contact structure 188 has a curved top surface, and there is no air gap generated in the bridging contact structure 188. After removing a portion of the bridging contact structure 188 using a polishing process, the curved top surface becomes a substantially flat top surface. Furthermore, there is no need to form a liner or a barrier layer to line the sidewall of the bridging contact structure 188, since the bridging contact structure 188 is formed in the bottom-up deposition process.

Since the conductive layer 181 is formed by the bottom-up deposition process, in some embodiments, an air gap 183 is embedded in a space, and the space is surrounded by the gate contact structure 170, the dielectric layer 152, the etch stop layer 162 and the bridging contact structure 188.

Generally, a conductive structure may be formed to connect the gate structure and the S/D contact structure over the S/D structure. However, as the device size shrank down, the conductive structure may need to be formed in a relatively small trench. In some cases, a bottom-up deposition may be performed to fill the conductive material in the small trench, so that fewer air gaps will be formed in the trench. However, since the S/D contact structure 156 may be much higher than the gate structure 142, when the conductive materials formed in the trench, the conductive material formed over the S/D contact structure 156 may block the opening of the trench first, so that the conductive material over the gate structure 142 (i.e. at deeper portion of the trench) may not be completely filled yet. That is, the S/D contact structure and the gate structure may not be well-connected.

Accordingly, a first conductive structure (e.g. the gate contact structure 170) is formed over the gate structure 142 first, and an upper portion of the conductive structure is removed to form a shortened conductive structure (e.g. the shortened gate contact structure 170). By forming the shortened conductive structure 170, the second conductive structure (e.g. the bridging contact structure 188) formed afterwards can be formed by a bottom-up deposition without worrying about blocking issues caused by the height difference described above. In addition, since the bridging contact structure 188 may be formed in bottom-up depositions, the filling of the trench may be improved and the performance of the resulting semiconductor device structure 100a may therefore also be improved.

Since the gate contact structure 170 is not formed by the bottom up deposition process, the void 171 may be formed in the gate contact structure 170. Although the void 171 may be formed in the gate contact structure 170, the resistance of the gate contact structure 170 is not serious affected by the void 171. In addition, the bridging contact structure 188 is formed by the bottom up deposition process, the quality of the bridging contact structure 188 is improved.

It is appreciated that although the cross-sectional views shown in FIGS. 2R-1 and 2R-2 are described with reference to a method, the structures are not limited to the method but rather may stand alone separate of the method.

Figure 3A:
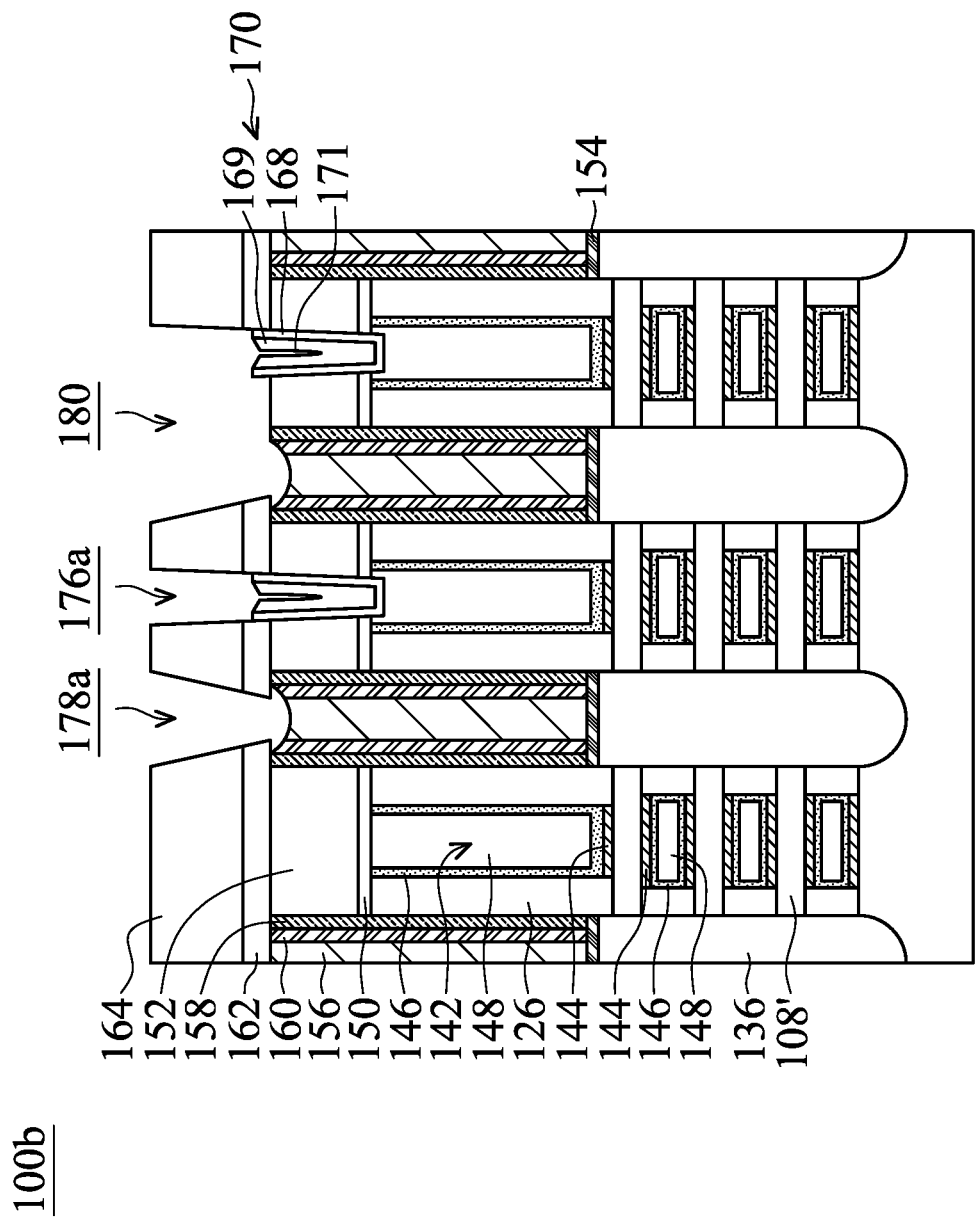
FIGS. 3A-3C illustrate cross-sectional views of another intermediate stage of manufacturing a semiconductor structure, in accordance with some embodiments.
Figure 3B:
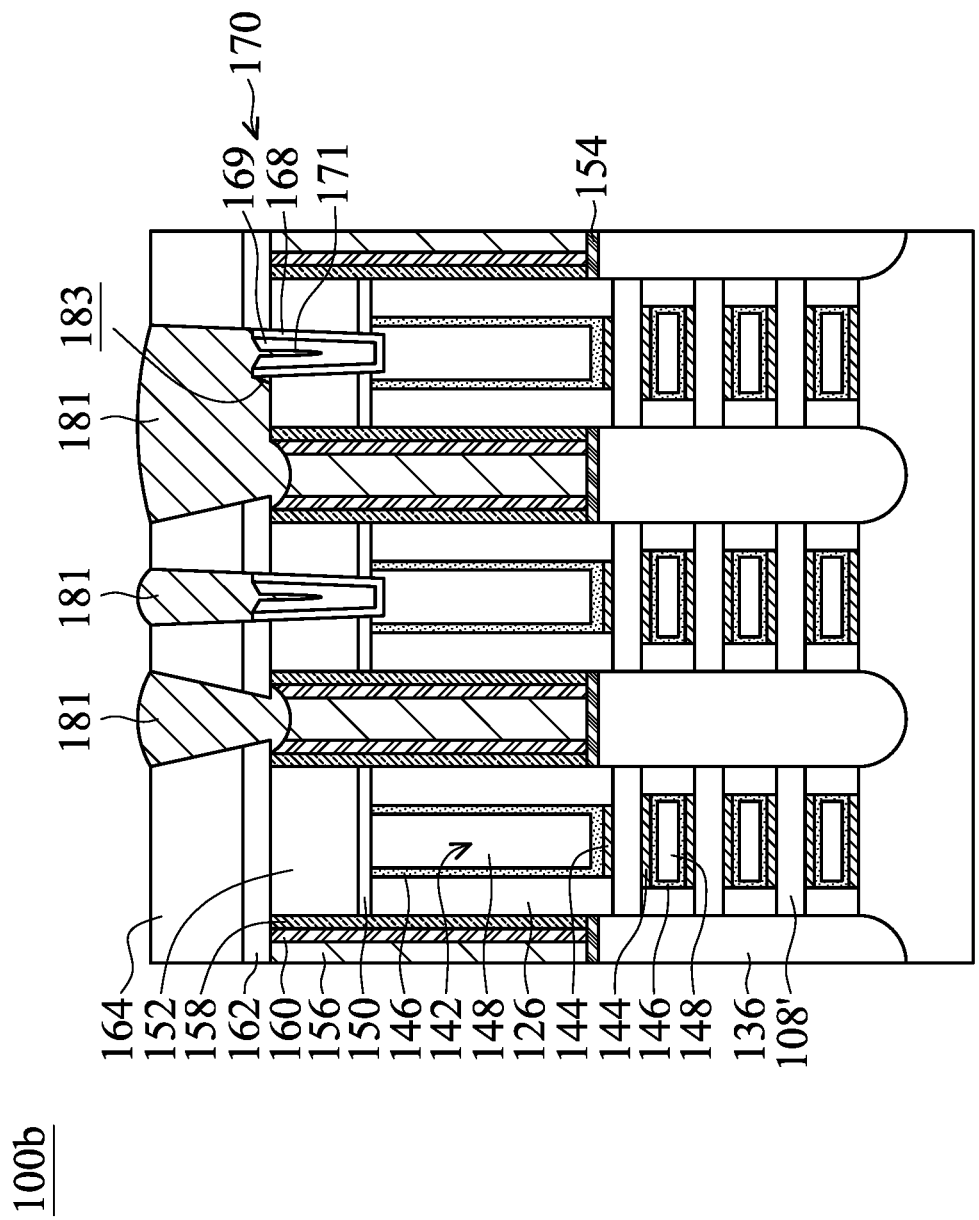
Figure 3C:
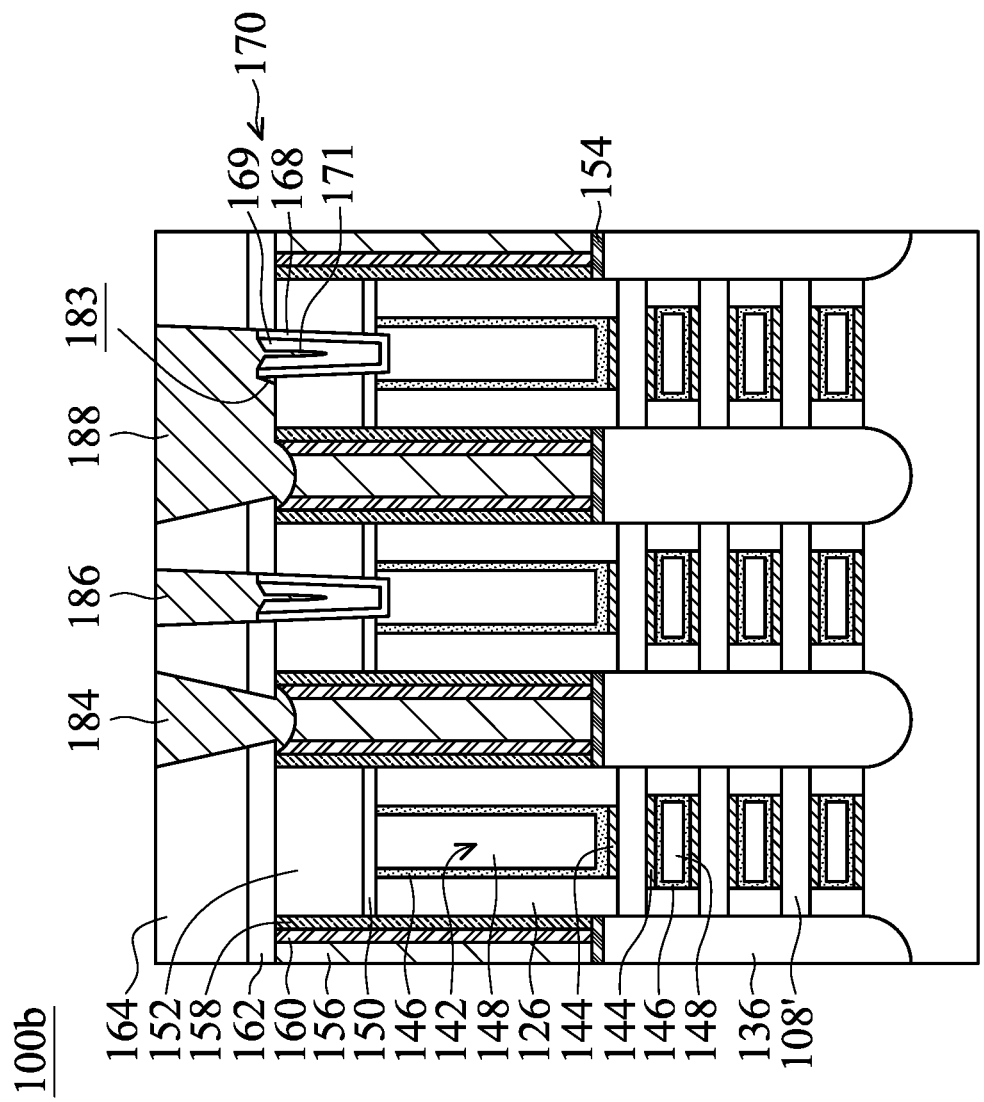

FIGS. 3A-3C illustrate cross-sectional views of another intermediate stage of manufacturing a semiconductor structure 100b, in accordance with some embodiments. The semiconductor structure 100b of FIG. 3A includes elements that are similar to, or the same as, elements of the semiconductor structure 100a of FIG. 2H-1, the difference between the FIG. 3A and FIG. 2H-1 is the shape of the S/D contact structure 156.

As shown in FIG. 3A, a top portion of the S/D contact structure 156 is removed after the etch stop layer 162 is removed. As a result, the top surface of the S/D contact structure 156 is curved. More specifically, the S/D contact structure 156 has a recessed top surface. In some embodiments, the S/D contact structure 156 has the concave top surface. The top surface of the S/D contact structure 156 is lower than the top surface of the dielectric layer 152. The topmost surface of the S/D contact structure 156 is lower than the bottom surface of the etch stop layer 162.

Afterwards, as shown in FIG. 3B, the conductive material 181 is formed in the trench 178a, the trench 176a and the combined trench 180, in accordance with some embodiments. In some embodiments, the conductive material 181 is formed in a bottom-up deposition process.

Next, as shown in FIG. 3C, a polishing process is performed to form the S/D conductive plug 184, the gate conductive plug 186, and the bridging contact structure 188 in the trench 178a, the trench 176a and the combined trench 180, in accordance with some embodiments.

In some embodiments, a CMP process is performed to polish the conductive material 181 so that the top surface of the S/D conductive plug 184, the top surface of the gate conductive plug 186, and the top surface of the bridging contact structure 188 are substantially level with the top surface of the dielectric layer 164.

If the gate contact structure 170 is formed by the bottom up deposition process, a cap layer may be needed to facilitate the formation of the gate contact structure 170. However, the cap layer may raise unwanted issues. Therefore, the gate contact structure 170 is not formed by the bottom up deposition process to have a better quality to facilitate the formation of the bridging contact structure 188. Since the gate contact structure 170 is not formed by the bottom up deposition process, the void 171 is formed in the gate contact structure 170. Furthermore, the gate structure 142 is in direct contact with the barrier layer 168 of the gate contact structure 170.

In some embodiments, the bottommost surface of the bridging contact structure 188 is in direct contact with the topmost surface of the S/D contact structure 156. In some embodiments, the bridging contact structure 188 and the S/D contact structure 156 are made of different materials, and the interface between the bridging contact structure 188 and the S/D contact structure 156 is lower than the top surface of the dielectric layer 152.

Figure 4:
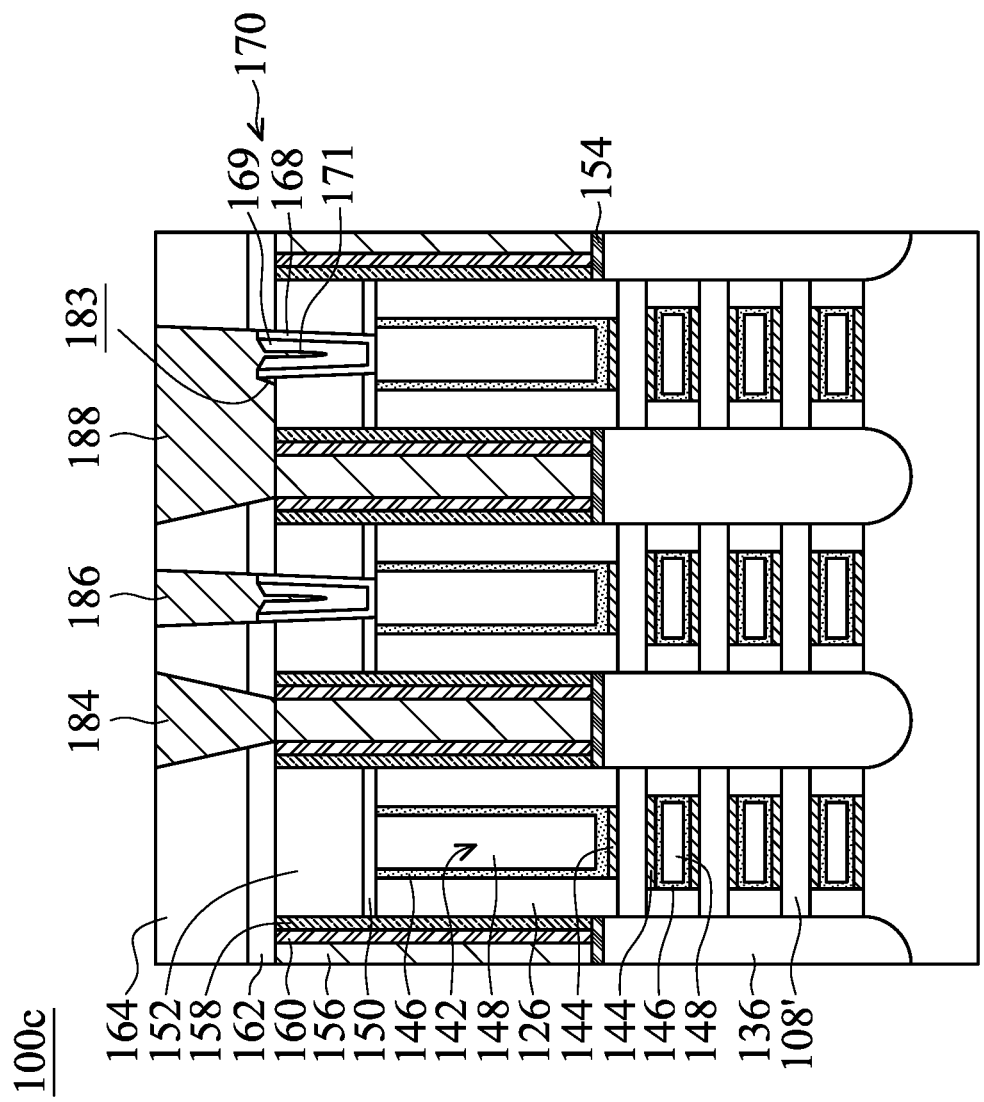
FIG. 4 illustrates a cross-sectional view of a semiconductor structure, in accordance with some embodiments.

FIG. 4 illustrates a cross-sectional view of a semiconductor structure 100c, in accordance with some embodiments. The semiconductor structure 100c of FIG. 4 includes elements that are similar to, or the same as, elements of the semiconductor structure 100a of FIG. 2R-1, the difference between the FIG. 4 and FIG. 2R-1 is the top surface of the gate structure 142 is substantially coplanar with the top surface of the dielectric layer 150. In other words, the top surface of the gate structure 142 is substantially coplanar with the bottom surface of the etch stop layer 152.

Figure 5:
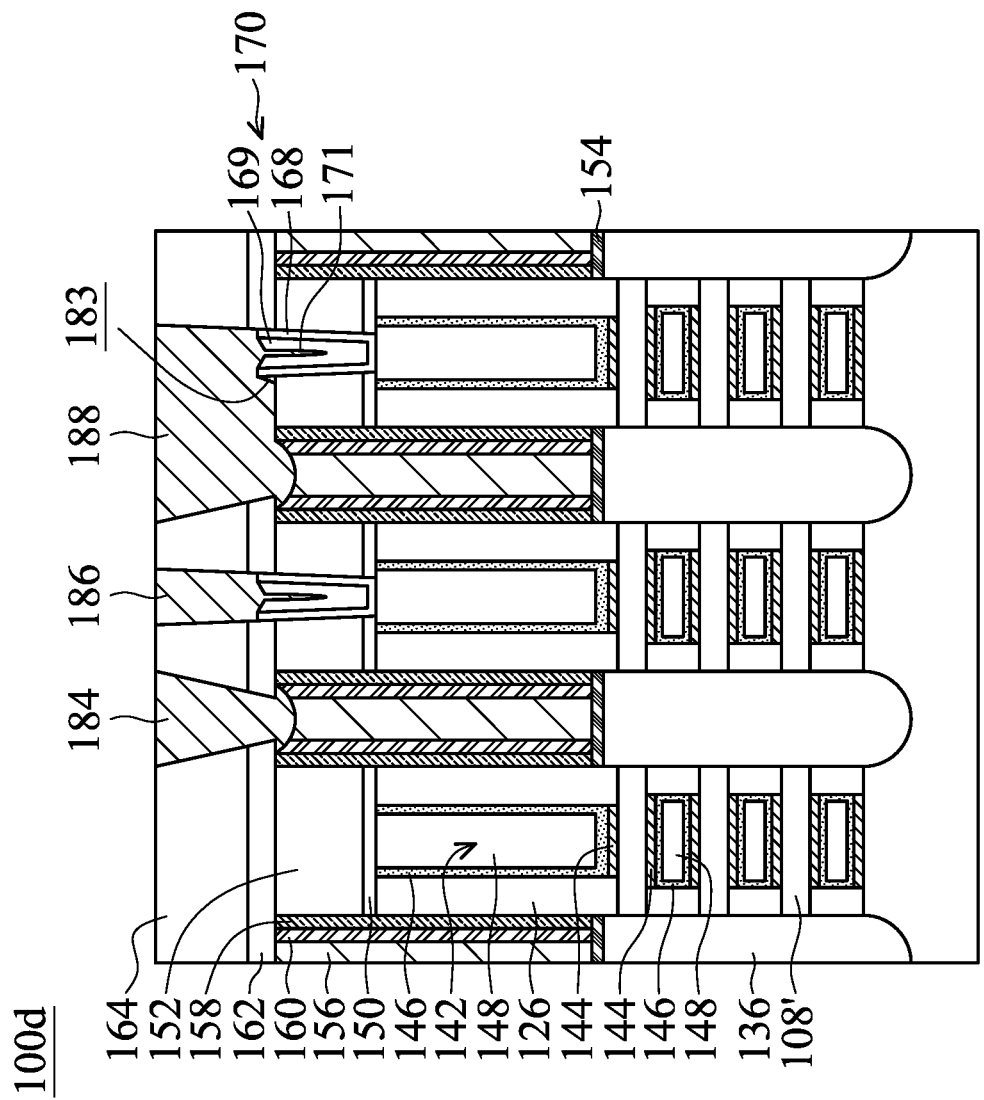
FIG. 5 illustrates a cross-sectional view of a semiconductor structure, in accordance with some embodiments.

FIG. 5 illustrates a cross-sectional view of a semiconductor structure 100d, in accordance with some embodiments. The semiconductor structure 100d of FIG. 5 includes elements that are similar to, or the same as, elements of the semiconductor structure 100b of FIG. 3C, the difference between FIG. 5 and FIG. 3C is that the top surface of the gate structure 142 is substantially coplanar with the top surface of the dielectric layer 150. In other words, the top surface of the gate structure 142 is substantially coplanar with the bottom surface of the etch stop layer 152.

Figure 6:
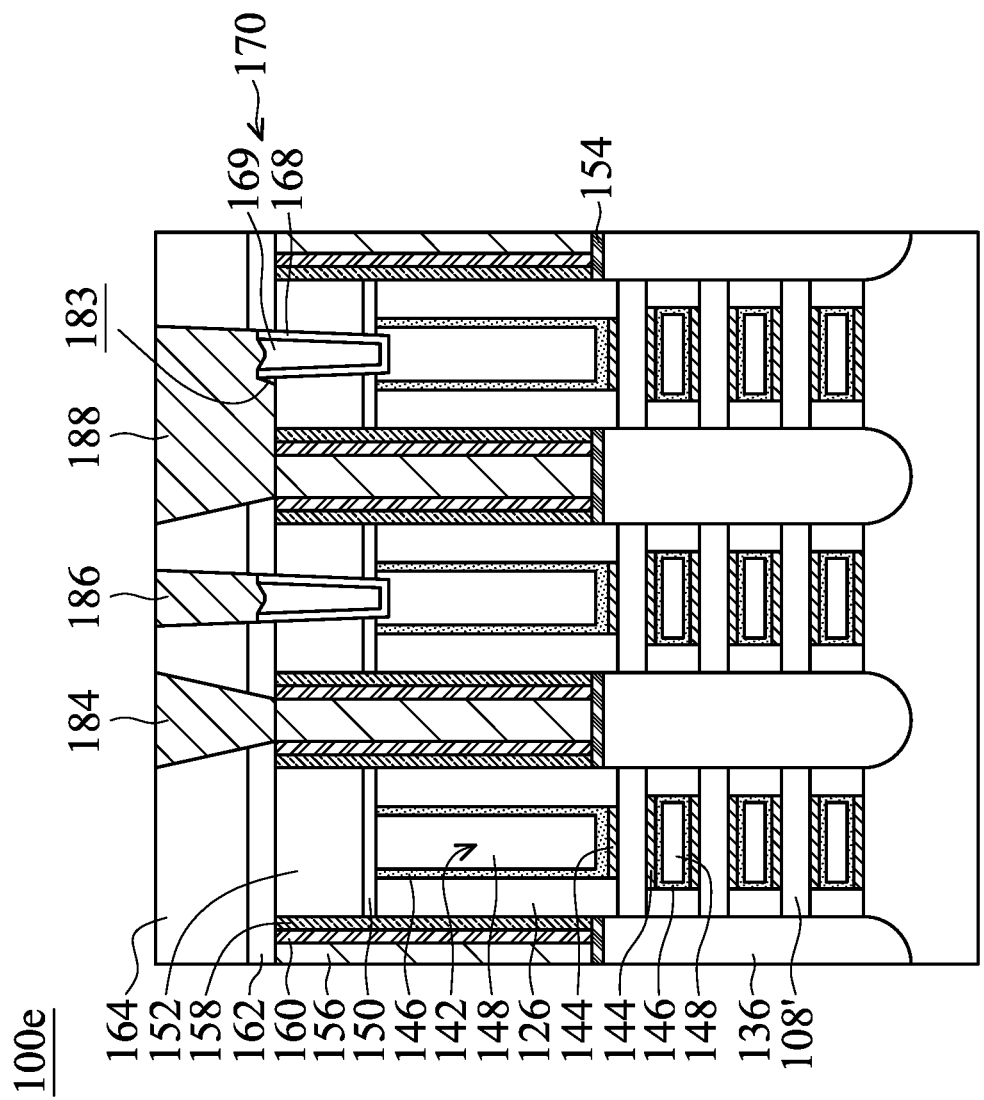
FIG. 6 illustrates a cross-sectional view of a semiconductor structure, in accordance with some embodiments.

FIG. 6 illustrates a cross-sectional view of a semiconductor structure 100e, in accordance with some embodiments. The semiconductor structure 100e of FIG. 6 includes elements that are similar to, or the same as, elements of the semiconductor structure 100a of FIG. 2R-1, the difference between FIG. 6 and FIG. 2R-1 is that, no void 171 is formed in the gate contact structure 170.

Figure 7:
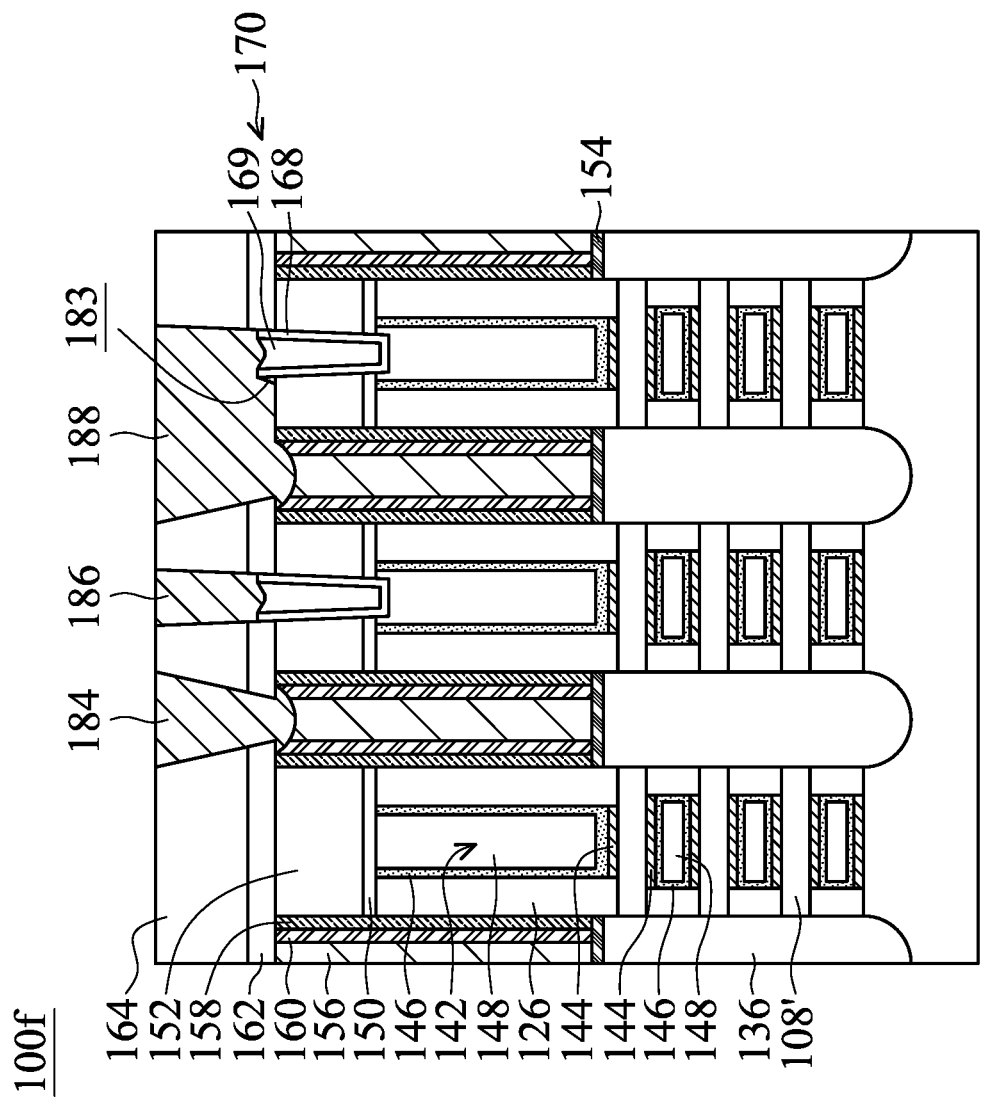
FIG. 7 illustrates a cross-sectional view of a semiconductor structure, in accordance with some embodiments.

FIG. 7 illustrates a cross-sectional view of a semiconductor structure 100f, in accordance with some embodiments. The semiconductor structure 100f of FIG. 7 includes elements that are similar to, or the same as, elements of the semiconductor structure 100b of FIG. 3C, the difference between the FIG. 7 and FIG. 3C is that, no void 171 is formed in the gate contact structure 170.

Figure 8:
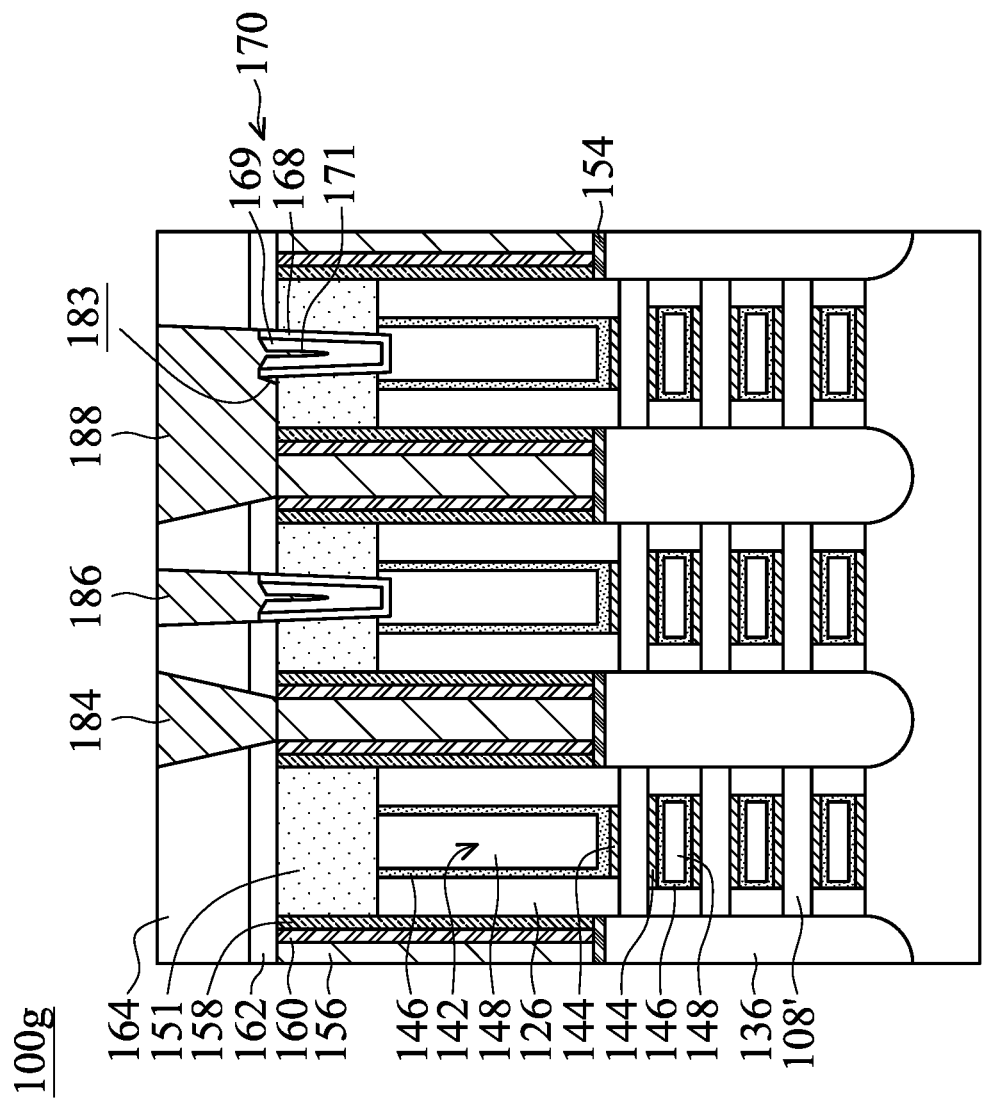
FIG. 8 illustrates a cross-sectional view of a semiconductor structure, in accordance with some embodiments.

FIG. 8 illustrates a cross-sectional view of a semiconductor structure 100g, in accordance with some embodiments. The semiconductor structure 100g of FIG. 8 includes elements that are similar to, or the same as, elements of the semiconductor structure 100a of FIG. 2R-1, the difference between FIG. 8 and FIG. 2R-1 is that, a mask layer 151 is formed over the gate structure 142, and the gate contact structure 170 is through the mask layer 151. The etch stop layer 162 is formed over the mask layer 151, and the dielectric layer 164 is formed over the etch stop layer 162.

In some embodiments, the mask layer 151 is made of $SiO_2$, $Si_3N_4$, SiON, SiOCN, SiOCH, or the like. The mask layer 151 may be formed using chemical vapor deposition (CVD), atomic layer deposition (ALD), electroplating, another applicable method, or a combination thereof.

Figure 9:
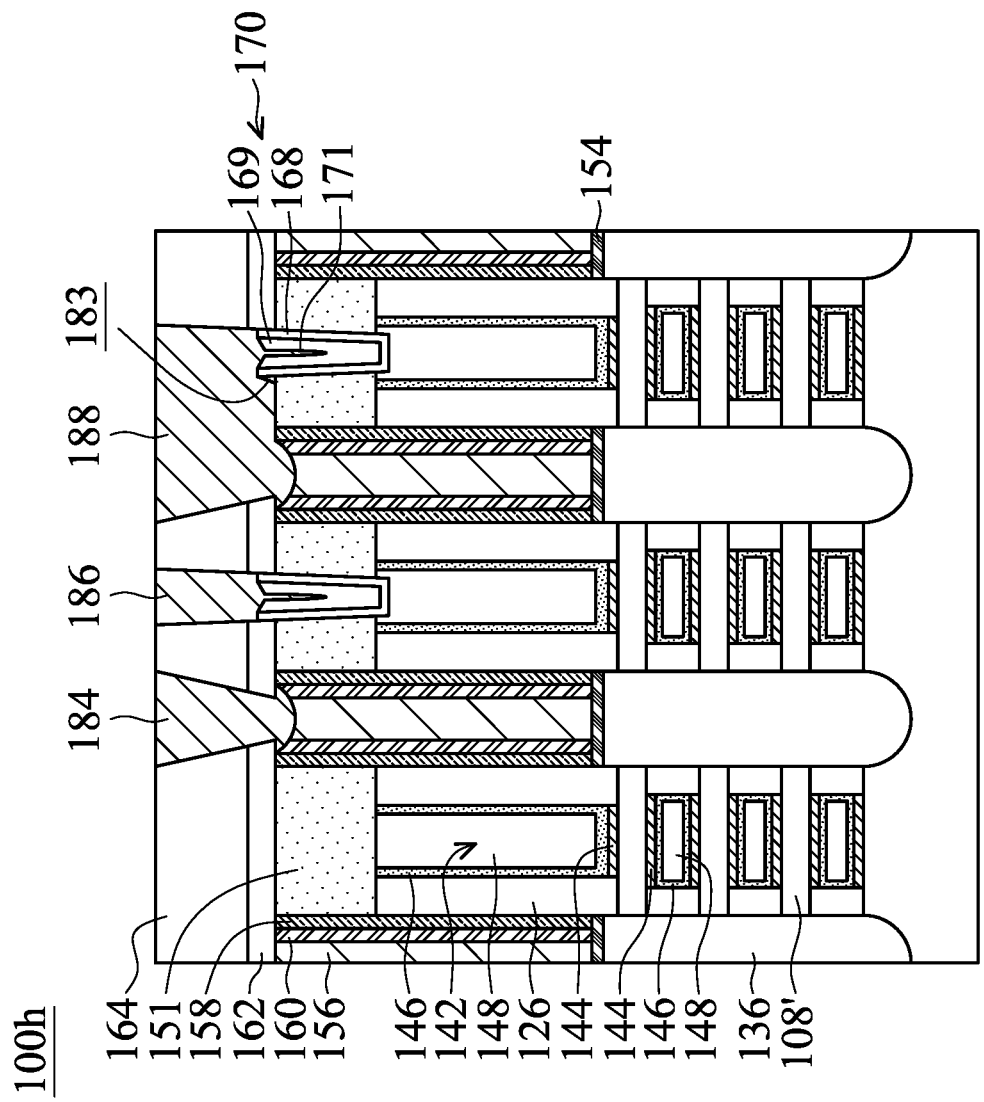
FIG. 9 illustrates a cross-sectional view of a semiconductor structure, in accordance with some embodiments.

FIG. 9 illustrates a cross-sectional view of a semiconductor structure 100h, in accordance with some embodiments. The semiconductor structure 100h of FIG. 9 includes elements that are similar to, or the same as, elements of the semiconductor structure 100b of FIG. 3C, the difference between the FIG. 9 and FIG. 3C is that the mask layer 151 is formed over the gate structure 142, and the gate contact structure 170 is through the mask 151.

Figure 10:
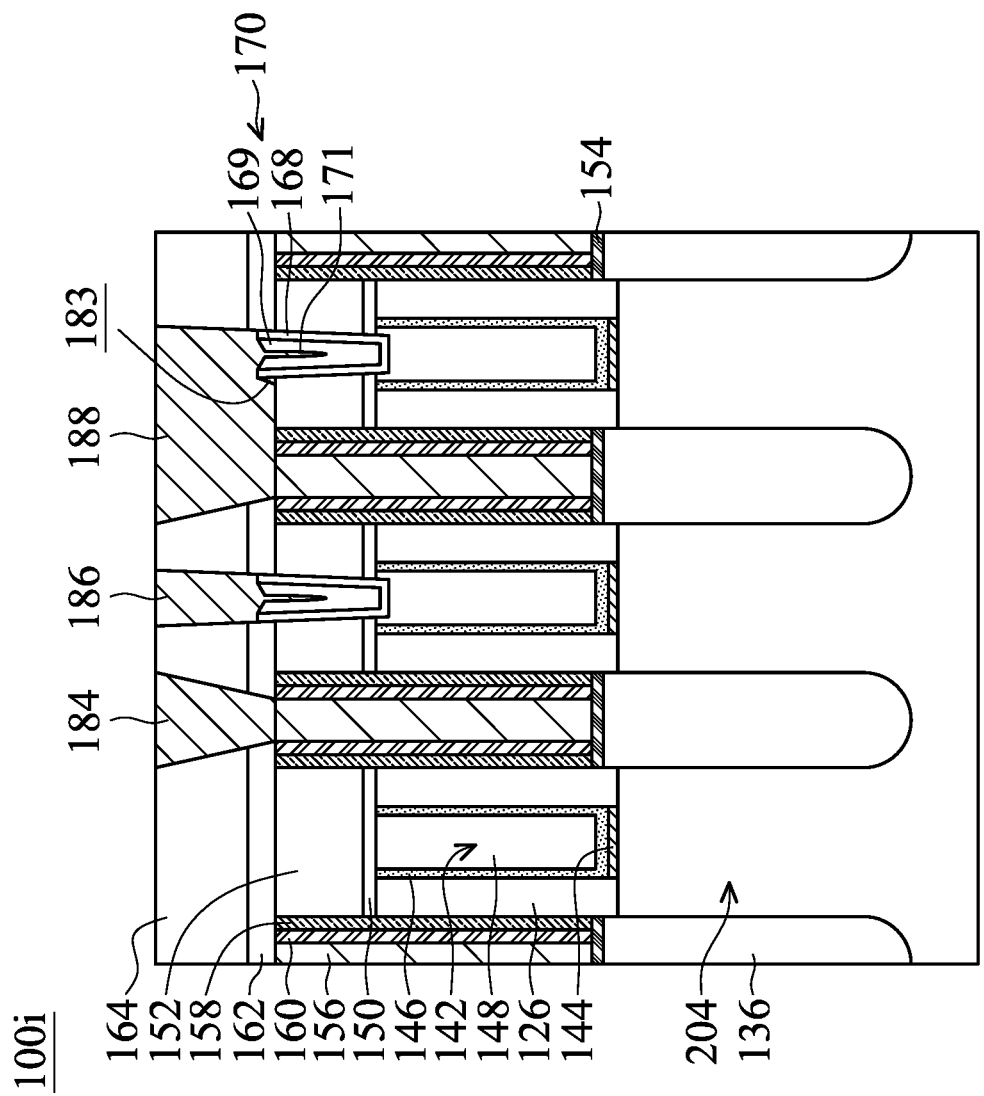
FIG. 10 illustrates a cross-sectional view of a semiconductor structure, in accordance with some embodiments.

FIG. 10 illustrates a cross-sectional view of a semiconductor structure 100i, in accordance with some embodiments. The semiconductor structure 100i of FIG. 10 includes elements that are similar to, or the same as, elements of the semiconductor structure 100a of FIG. 2R-1, the difference between FIG. 10 and FIG. 2R-1 is that the semiconductor structure 100i is a FinFET structure in accordance with some embodiments. Materials and processes for manufacturing the semiconductor structure 100i may be similar to, or the same as, those for manufacturing the semiconductor structure 100a described above and are not repeated herein.

More specifically, a fin structure 204 is formed protruding from the substrate 102 and the gate structure 142 is formed across the fin structure 204, as shown in FIG. 10, in accordance with some embodiments.

Figure 11:
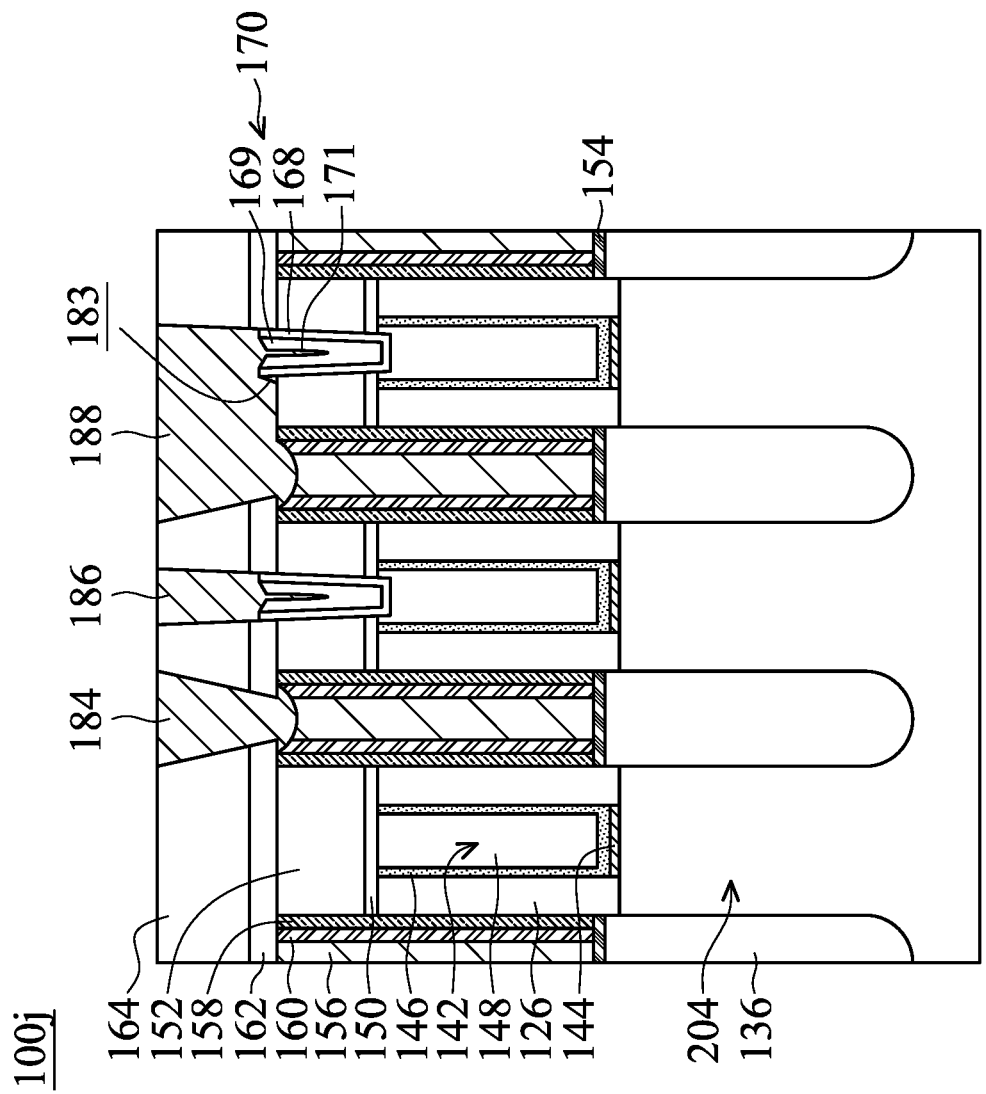
FIG. 11 illustrates a cross-sectional view of a semiconductor structure, in accordance with some embodiments.

FIG. 11 illustrates a cross-sectional view of a semiconductor structure 100j, in accordance with some embodiments. The semiconductor structure 100j of FIG. 11 includes elements that are similar to, or the same as, elements of the semiconductor structure 100b of FIG. 3C, the difference between the FIG. 11 and FIG. 3C is that the semiconductor structure 100j is a FinFET structure in accordance with some embodiments. Materials and processes for manufacturing the semiconductor structure 100j may be similar to, or the same as, those for manufacturing the semiconductor structure 100a described above and are not repeated herein. More specifically, a fin structure 204 is formed protruding from the substrate 102 and the gate structure 142 is formed across the fin structure 204, as shown in FIG. 11, in accordance with some embodiments.

It should be appreciated that the semiconductor structures 100a to 100h having the shortened gate contact structure 170 and the bridging contact structure 188 described above may also be applied to FinFET structures, similar to that shown in FIGS. 10 and 11, although not shown in the figures.

It should be noted that same elements in FIGS. 1A to 11 may be designated by the same numerals and may include similar or the same materials and may be formed by similar or the same processes; therefore such redundant details are omitted in the interest of brevity. In addition, although FIGS. 1A to 11 are described in relation to the method, it will be appreciated that the structures disclosed in FIGS. 1A to 11 are not limited to the method but may stand alone as structures independent of the method. Similarly, although the methods shown in FIGS. 1A to 11 are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure includes forming a gate structure, a source/drain (S/D) structure adjacent to the gate structure, and an S/D contact structure over the S/D structure. A gate contact structure is formed over the gate structure, and the top portion of the first conductive structure is removed afterwards. A bridging contact structure is formed over the S/D contact structure and the gate contact structure. Since no cap layer is pre-formed on the gate structure, the gate contact structure is in direct contact with the gate electrode layer of the gate structure without using cap layer as a seed layer. Therefore, the quality of the gate contact structure is improved. In addition, since the height difference between the shortened gate contact structure and the S/D contact structure is relatively small, the bridging contact structure may be better formed and the performance of the semiconductor structure may be improved.

In some embodiments, a method for manufacturing a semiconductor structure is provided. The method for manufacturing forming a gate structure over a substrate, and forming a first dielectric layer over the gate structure. The method also includes forming a source/drain (S/D) structure adjacent to the gate structure, and forming an S/D contact structure over the S/D structure. The method includes forming a second dielectric layer over the S/D contact structure and the mask layer, and forming a first trench through the first dielectric layer and the second dielectric layer over the gate structure to expose the top surface of the gate structure. The method further includes forming a gate contact structure in the first trench, and the gate contact structure is in direct contact with the gate structure. The method includes removing the top portion of the gate contact structure, and forming a bridging contact structure over the gate contact structure and the S/D contact structure. The bridging contact structure is in direct contact with the gate contact structure and the S/D contact structure.

In some embodiments, a method for manufacturing a semiconductor structure is provided. The method for manufacturing the semiconductor structure includes forming nanostructures over a substrate, and forming a gate structure wrapped around the nanostructures. The method includes forming a source/drain (S/D) structure attached to the nanostructures adjacent to the gate structure, and forming an S/D contact structure on the S/D structure. The method also includes forming a dielectric layer over the S/D contact structure and the gate structure, and forming a gate contact structure through the dielectric layer and covering the gate structure. The gate contact structure includes a barrier layer and a conductive layer over the barrier layer, and the barrier layer is in direct contact with the gate structure. The method also includes etching the top portion of the gate contact structure to form a shorted gate contact structure. The method further includes forming a bridging contact structure on the shorted gate contact structure and the S/D contact structure, and the S/D contact structure is connected to the shorted gate contact structure by the bridging contact structure.

In some embodiments, a semiconductor structure is provided. The semiconductor structure includes a gate structure formed over a substrate, and a source/drain (S/D) structure formed adjacent to the gate structure. The semiconductor structure includes a dielectric layer formed over the S/D structure, and an S/D contact structure formed over the S/D structure. The S/D contact structure is through the dielectric layer. The semiconductor structure includes a gate contact structure formed through the dielectric layer and landing on the gate structure, and the gate contact structure is in direct contact with the gate structure. The semiconductor structure includes a bridging contact structure covering the gate contact structure and the S/D contact structure, and the bottommost surface of the bridging contact structure is in direct contact with a topmost surface of the S/D contact structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a gate structure over a substrate;
    forming a first dielectric layer over the gate structure;
    forming a source/drain (S/D) structure adjacent to the gate structure;
    forming an S/D contact structure over the S/D structure;
    forming a second dielectric layer over the S/D contact structure;
    forming a first trench through the first dielectric layer and the second dielectric layer over the gate structure to expose a top surface of the gate structure;
    forming a gate contact structure in the first trench, wherein the gate contact structure is in direct contact with the gate structure;
    removing a top portion of the gate contact structure; and
    forming a bridging contact structure over the gate contact structure and the S/D contact structure, wherein the bridging contact structure is in direct contact with the gate contact structure and the S/D contact structure.

2. The method for manufacturing the semiconductor structure as claimed in claim 1, wherein forming the gate contact structure in the first trench further comprises:
    forming a barrier layer in the first trench; and
    forming a conductive layer on the barrier layer, wherein the barrier layer is in direct contact with a gate electrode layer of the gate structure.

3. The method for manufacturing the semiconductor structure as claimed in claim 1, wherein a portion of the gate contact structure is lower than a topmost surface of the gate structure.

4. The method for manufacturing the semiconductor structure as claimed in claim 1, further comprising:
    forming a mask layer over the gate structure, wherein the gate contact structure is through the mask layer.

5. The method for manufacturing the semiconductor structure as claimed in claim 1, further comprising:
    removing a top portion of the S/D contact structure, wherein the S/D contact structure has a recessed top surface, and the recessed top surface is lower than a top surface of the first dielectric layer.

6. The method for manufacturing the semiconductor structure as claimed in claim 1, further comprising:
    forming a second trench over the S/D contact structure, wherein the second trench is connected to the first trench, wherein a top surface of the S/D contact structure is exposed by the second trench.

7. The method for manufacturing the semiconductor structure as claimed in claim 6, further comprising:
    forming the bridging contact structure in the second trench using a deposition process, wherein the bridging contact structure has a curved top surface and no air gap is generated in the bridging contact structure; and
    removing a portion of the bridging contact structure, so that the curved top surface becomes a substantially flat top surface.

8. The method for manufacturing the semiconductor structure as claimed in claim 1, wherein a portion of the bridging contact structure is in direct contact with the first dielectric layer.

9. The method for manufacturing the semiconductor structure as claimed in claim 1, wherein no liner layer is lining a sidewall the bridging contact structure.

10. A method for manufacturing a semiconductor structure, comprising:
    forming nanostructures over a substrate;
    forming a gate structure wrapped around the nanostructures;
    forming a source/drain (S/D) structure attached to the nanostructures adjacent to the gate structure;
    forming an S/D contact structure on the S/D structure;
    forming a dielectric layer over the S/D contact structure and the gate structure;
    forming a gate contact structure through the dielectric layer and covering the gate structure, wherein the gate contact structure comprises a barrier layer and a conductive layer over the barrier layer, and the barrier layer is in direct contact with the gate structure;
    etching a top portion of the gate contact structure to form a shortened gate contact structure; and
    forming a bridging contact structure on the shorted gate contact structure and the S/D contact structure, wherein the S/D contact structure is connected to the shorted gate contact structure by the bridging contact structure.

11. The method for manufacturing the semiconductor structure as claimed in claim 10, further comprising:
    forming an etch stop layer over the S/D contact structure, wherein the etch stop layer is between the S/D contact structure and the dielectric layer, and a bottom surface of the etch stop layer is lower than a top surface of the shorted gate contact structure.

12. The method for manufacturing the semiconductor structure as claimed in claim 10, wherein a void is exposed after etching the top portion of the gate contact structure.

13. The method for manufacturing the semiconductor structure as claimed in claim 10, further comprising:
    removing a top portion of the S/D contact structure, wherein the S/D contact structure has a recessed top surface.

14. The method for manufacturing the semiconductor structure as claimed in claim 10, further comprising:
    forming the bridging contact structure using a deposition process, wherein the bridging contact structure has a curved top surface and no air gap is generated in the bridging contact structure; and
    removing a portion of the bridging contact structure, so that the curved top surface becomes a substantially flat top surface.

15. A method for manufacturing a semiconductor structure, comprising:

forming nanostructures over a substrate;

forming a gate structure wrapped around the nanostructures;

forming a source/drain (S/D) structure attached to the nanostructures adjacent to the gate structure;

forming an S/D contact structure on the S/D structure;

forming a dielectric layer over the S/D contact structure and the gate structure;

forming a gate contact structure through the dielectric layer and covering the gate structure, wherein a void is in the gate contact structure;

removing a top portion of the gate contact structure to form a shortened gate contact structure to expose the void; and forming a bridging contact structure on the shorted gate contact structure and the S/D contact structure.

16. The method for manufacturing the semiconductor structure as claimed in claim 15, wherein a top surface of the shorted gate contact structure is higher than the top surface of the S/D contact structure.

17. The method for manufacturing the semiconductor structure as claimed in claim 15, wherein the step of forming the bridging contact structure is formed by a bottom up deposition.

18. The method for manufacturing the semiconductor structure as claimed in claim 15, further comprising:

removing a top portion of the S/D contact structure, wherein the S/D contact structure has a recessed top surface.

19. The method for manufacturing the semiconductor structure as claimed in claim 15, wherein the bridging contact structure and the S/D contact structure are made of different materials.

20. The method for manufacturing the semiconductor structure as claimed in claim 15, wherein no liner layer is lining a sidewall the bridging contact structure.

* * * * *